United States Patent [19]

Hagiwara et al.

[11] Patent Number: 5,685,895

[45] Date of Patent: Nov. 11, 1997

[54] AIR CLEANING APPARATUS USED FOR AN EXPOSURE APPARATUS

[75] Inventors: Shigeru Hagiwara; Noriaki Tokuda, both of Kawasaki, Japan

[73] Assignee: Nikon Corporation, Tokyo, Japan

[21] Appl. No.: 513,152

[22] Filed: Aug. 9, 1995

[30] Foreign Application Priority Data

| Aug. 10, 1994 | [JP] | Japan | 6-188341 |
| Apr. 27, 1995 | [JP] | Japan | 7-103887 |

[51] Int. Cl.$^6$ ............................................. B01D 53/04
[52] U.S. Cl. ............................. 96/117; 96/134; 96/142; 55/274
[58] Field of Search ................. 55/270, 274; 95/128, 95/133–137; 96/108, 117, 134, 135, 142, 153

[56] References Cited

U.S. PATENT DOCUMENTS

| 3,564,818 | 2/1971 | Lasky et al. | 95/137 |
| 3,630,690 | 12/1971 | Coppola | 96/134 X |
| 3,646,594 | 2/1972 | Lasky et al. | 95/137 X |
| 3,727,379 | 4/1973 | Bijleveld et al. | 95/137 |
| 3,780,500 | 12/1973 | Clemens et al. | 95/135 |
| 3,902,485 | 9/1975 | Wallace | 55/274 X |
| 4,050,291 | 9/1977 | Nelson | 55/270 X |
| 4,095,965 | 6/1978 | Neumann et al. | 55/270 X |
| 4,181,513 | 1/1980 | Fukuda et al. | 96/153 |
| 4,244,713 | 1/1981 | Goodwin | 55/270 X |
| 4,533,368 | 8/1985 | Snaddon et al. | 55/274 X |
| 4,537,760 | 8/1985 | Lavie | 95/128 X |
| 4,684,510 | 8/1987 | Harkins | 95/137 X |
| 4,936,877 | 6/1990 | Hultquist et al. | 55/270 X |
| 5,053,064 | 10/1991 | Hama et al. | 96/134 X |
| 5,122,170 | 6/1992 | Satoh et al. | 96/134 |
| 5,166,530 | 11/1992 | McCleary | 250/492.2 |
| 5,169,419 | 12/1992 | Mori et al. | 55/274 X |
| 5,207,505 | 5/1993 | Naraki et al. | 363/373 |
| 5,226,937 | 7/1993 | Linnersten et al. | 96/134 X |
| 5,253,310 | 10/1993 | Delbare et al. | 385/14 |
| 5,288,298 | 2/1994 | Aston | 96/135 X |
| 5,294,407 | 3/1994 | Succi et al. | 55/274 X |
| 5,307,207 | 4/1994 | Ichihara | 359/622 |
| 5,334,237 | 8/1994 | Lorimer | 55/270 X |
| 5,350,443 | 9/1994 | von Blücher et al. | 96/135 |
| 5,460,636 | 10/1995 | Harada et al. | 96/134 X |

FOREIGN PATENT DOCUMENTS

| 0438036 | 7/1991 | European Pat. Off. | 96/108 |
| 0495393 | 7/1992 | European Pat. Off. | 96/108 |
| 50-036375 | 4/1975 | Japan | 95/137 |
| 53-014187 | 2/1978 | Japan | 96/128 |
| 55-039212 | 3/1980 | Japan | 96/142 |
| 55-084515 | 6/1980 | Japan | 96/108 |
| 63-100959 | 5/1988 | Japan | 55/270 |
| 63-147568 | 6/1988 | Japan | 55/270 |
| 3-270008 | 12/1991 | Japan | 55/270 |
| 4-139453 | 5/1992 | Japan | . |
| 4-180809 | 6/1992 | Japan | 55/270 |
| 0483994 | 12/1975 | U.S.S.R. | 95/135 |

*Primary Examiner*—Robert Spitzer
*Attorney, Agent, or Firm*—Shapiro and Shapiro

[57] ABSTRACT

A chemical filter for removing a chemical impurity is arranged at an air inlet, and a gas sensor for adsorbing the chemical impurity is arranged upstream of the chemical filter. The service life of the chemical filter is determined on the basis of the resonance frequency of the gas sensor. Alternatively, the chemical filter has a specific portion whose removal capacity for the chemical impurity is lower than that of the rest, and a sensor for sensing the chemical impurity is arranged downstream of the specific portion. The service life of the chemical filter is predicted on the basis of an output from the sensor.

11 Claims, 12 Drawing Sheets

AIR CLEANING APPARATUS USED FOR AN EXPOSURE APPARATUS

BACKGROUND OF THE INVENTION

1. Field of the Invention

The present invention relates to an exposure apparatus for use in a photolithography process for fabricating microdevices such as semiconductor devices, liquid crystal displays, thin film magnetic heads, image pickup devices (CCDs), and magneto-optical disks and, more particularly, to an air cleaning apparatus including a filter for removing chemical pollutants from air supplied to an exposure apparatus.

2. Related Background Art

Conventionally, apparatuses which illuminate an object with light from a discharge lamp have been used in a variety of applications in various fields. In particular, a reduction projection exposure apparatus (e.g., a stepper or an aligner) used in a photolithography process for fabricating semiconductor devices or the like makes use of an apparatus for illuminating a reticle with light having a specific wavelength (e.g., i line at 365 nm or g line at 436 nm) of output light from a super-high pressure mercury lamp (e.g., an Hg lamp or an Xe-Hg lamp).

Research and development are being extensively done to transfer fine patterns onto photosensitive substrates with a high resolution by using such a projection exposure apparatus. Generally, assuming the numerical aperture of a projecting optical system of a projection exposure apparatus is NA and the wavelength of exposure light is $\lambda$, a resolution RT and a depth of focus DOF of the projection exposure apparatus can be represented as follows:

$$RT = k_1 \cdot \lambda / NA \quad (1)$$

$$DOF = k_2 \cdot \lambda / NA^2 \quad (2)$$

where $k_1$ and $k_2$ are coefficients determined by the process. It is evident from the above equations that miniaturization of patterns is accomplished by either of the following two methods:

1) An increase in numerical aperture NA of a projecting optical system.

2) A decrease in wavelength (exposure wavelength) $\lambda$ of exposure light.

In accordance with the method of increasing the numerical aperture of a projecting optical system, projecting optical systems having numerical apertures of 0.5 to 0.65 are put into practical use, and the resolution is improved accordingly. However, simply increasing the numerical aperture NA of a projecting optical system results in the inconvenience that, as is apparent from equation (2), the depth of focus DOF decreases inversely proportional to the square of the numerical aperture NA. Generally, in the semiconductor fabrication process, an image of a circuit pattern is in many cases projected onto a wafer on which steps are formed in the preceding step. Also, wafers have flatness errors. It is therefore necessary to ensure a sufficiently large value as the depth of focus DOF. In contrast, in the method of decreasing the wavelength of exposure light, the depth of focus DOF decreases directly proportional to the wavelength $\lambda$ of exposure light as shown by equation (2). Accordingly, improving the resolution by decreasing the wavelength of exposure light is more advantageous than increasing the numerical aperture, in ensuring the depth of focus.

From the above background, as the exposure light in projection exposure apparatuses an emission line called i line (wavelength 365 nm) of a mercury lamp is currently primarily used in place of a conventionally used emission line called g line (wavelength 436 nm) of the same mercury lamp.

FIG. 13 shows one example of a conventional illuminating optical apparatus using a super-high pressure mercury lamp as a light source. In FIG. 13, the light emission point of a mercury lamp 1 is arranged on a first focal point F1 of an elliptical mirror 2. This elliptical mirror 2 has a hole into which an electrode, portion of the mercury lamp 1 is inserted. On the inner surface of the elliptical mirror 2, aluminum or various multilayered dielectric materials are deposited. This inner surface functions as a reflecting surface. Light L emitted from the mercury lamp 1 and reflected by the elliptical mirror 2 is reflected by a mirror 3 and focused on a second focal point F2 of the elliptical mirror 2. Consequently, a light source image is formed on this second focal point F2. Aluminum or various multilayered dielectric materials are also deposited on the reflecting surface of the mirror 3.

Divergent light from this light source image is converted into a bundle of nearly parallel rays by an input lens 4 and fed into a narrow-band bandpass filter (wavelength selecting element) 5. Light (e.g., i line) having a particular wavelength chosen by the bandpass filter 5 enters a fly-eye lens 6 as an optical integrator. Consequently, a large number of secondary light sources (light source images) are formed on the focal plane on the back side (reticle side) of the fly-eye lens 6. Divergent light components from these secondary light sources are reflected by a mirror 7, converted into a bundle of almost parallel rays by a condenser lens 8, and superposed on a reticle R. Aluminum or various multilayered dielectric materials are also deposited on the reflecting surface of the mirror 7.

The illuminating optical apparatus shown in FIG. 13 is made compact as a whole by the use of the mirrors 3 and 7 for deflecting the optical path. Also, the inner surface of the elliptical mirror 2 and the reflecting surfaces of the mirrors 3 and 7 are so designed as to be able to obtain the respective maximum reflectances at the wavelength of the exposure light. FIG. 14 shows the emission spectrum distribution of the super-high pressure mercury lamp 1. FIG. 15A shows the wavelength dependence of the reflectance of a reflecting mirror having a surface on which aluminum is deposited. FIG. 15B shows the wavelength dependence of the reflectance of a reflecting mirror having a surface on which a multilayered dielectric film is deposited. Also, FIG. 16 illustrates the wavelength dependence of the transmittance of the bandpass filter 5 when the exposure light is i line (wavelength 365 nm). As a result, the reticle R is illuminated with a uniform illuminance only by the exposure light (i line) emitted from the mercury lamp 1 and selected by the bandpass filter 5. Attenuation of this exposure light is also minimized.

This conventional illuminating optical apparatus has the inconvenience that the surfaces of the optical members (in FIG. 13, the elliptical mirror 2, the mirror 3, the input lens 4, and the bandpass filter 5) from the mercury lamp 1 to the bandpass filter 5 are clouded, and consequently the reflectance or the transmittance of each optical member gradually decreases; i.e., the illumination efficiency (the illuminance on the reticle R) of the illuminating optical apparatus decreases. Optical members are clouded because specific substances stick to their surfaces. As a result of the analysis done by ion chromatography, it turns out that one specific substance is ammonium sulfate (($NH_4)_2SO_4$) and the specific substances are in many instances this ammonium sulfate.

It is also found by the analysis using an SEM (Scanning Electron Microscope) that silicon oxide ($SiO_x$) sometimes adheres to the surface of a lens or a mirror. If silicon oxide adheres, scattering takes place on the surface of an optical member if the surface is not smooth, or an antireflection film or a reflecting film falls outside the proper conditions in the case of an optical member having a smooth surface. The result is that the transmittance or the reflectance essentially decreases, leading to a reduction in the illuminance.

It is considered that this specific substance is produced by a photo-chemical reaction occurring between ammonium ions ($NH_4^+$) and sulfuric acid ions ($SO_4^{2-}$) or organic silanol, existing for some reason, upon irradiation of far-ultraviolet light (UV light). It has been considered that these ions or compound molecules are produced from the surface of a black anodized aluminum (BAm) material, which is often used as a holding member or a shielding member in illuminating optical apparatuses, are originally present in air in a clean room in which a projection exposure apparatus is installed, or are ionized by irradiation of UV light. A diazo dye is used in the black anodized aluminum material, and sulfuric acid is used in the black anodized aluminum treatment process. These substances can be generation sources of ammonium radicals and sulfuric acid radicals that are constituent substances of ammonium sulfate.

The present inventors, therefore, measured contaminations of optical members by irradiating UV light onto black anodized aluminum materials in a nitrogen ($N_2$) atmosphere, an oxygen ($O_2$) atmosphere, and an air atmosphere containing a lot of water vapor. As a result, the largest amounts of ammonium radicals and sulfuric acid radicals were produced in the air atmosphere, and the second largest amounts of these ions were produced in the oxygen atmosphere. That is, it is confirmed that contaminations of optical members are most likely to be encouraged by the presence of water vapor in air.

It is also considered that oxygen ($O_2$) turns into highly reactive ozone when irradiated with UV light and this ozone encourages the generation of ions from the wall surfaces of, e.g., a holding member, or the ionization of a gas in air. Unfortunately, it was not possible to find the generation source of silicon oxide in the illuminating optical apparatus.

Furthermore, the present inventors examined the installation environment dependence Of contaminations of the illuminating optical apparatus. The result was that large amounts of ion substances of ammonium radicals, sulfuric acid radicals, and nitric acid radicals were present, and large amounts of organic silanes such as HMDS (hexamethyldisiloxane) and trimethylsilanol were detected in some places. HMDS is a material often used as a surface treatment material in applying a photosensitive material to a wafer. Trimethylsilanol is a substance produced by hydrolysis of HMDS. As a result of the investigation, it is found that there is a highly distinct correlation between the amount of the specific substances which cloud optical members and the amount of the impurities described above in the installation environment.

As described above, the present inventors have made extensive studies on the contaminations and states of optical members and found that the generation sources of the specific substances which cloud optical members exist in the installation environment of an apparatus, rather than in the apparatus itself.

Recently, the degree of integration of semiconductor integrated circuits has increased more and more, and it is required to form a minimum line width of a circuit on a submicron order. One microprocessing technique of meeting this requirement of submicron line formation is to decrease the wavelength of exposure light used in a projection exposure apparatus for fabricating semiconductor integrated circuits. Short-wavelength exposure light presently attracting attention includes for example, a KrF excimer laser beam at a wavelength of 248 nm, a harmonic of titanium-sapphire laser, a four-fold harmonic (wavelength 266 nm) or a five-fold harmonic (wavelength 213 nm) of a YAG laser, or an ArF excimer laser beam at a wavelength of 193 nm.

In projection exposure apparatuses using exposure light having a relatively long wavelength, e.g., g line or i line, an image of a pattern of a reticle is transferred to a so-called novolak-based photoresist (photosensitive resin) made from a novolak resin and a photosensitive material. If, however, the wavelength of exposure light is decreased, e.g., if a KrF excimer laser beam (wavelength 248 nm) is used as the exposure light, it is impossible for the conventional novolak-based photoresist to form patterns having good shapes, since, for example, the light absorption of the resin increases.

For this reason, for exposure apparatuses using short-wavelength light such as an excimer laser, a new type photoresist called a chemical amplification type photoresist is being developed which is improved in characteristics such as a pattern formation characteristic and resolution. The chemical amplification type photoresist generally consists of a resin, a photosensitive acid generator, and a solubilizer or a crosslinking agent. The acid generator generates an acid upon exposure. During baking (PEB) after the exposure, this acid functions as a catalyst to encourage the reaction of the solubilizer or the crosslinking agent, and a pattern is formed by development. A photoresist using the solubilizer forms positive patterns, and a photoresist using the crosslinking agent forms negative patterns.

Unfortunately, the chemical amplification type photoresist lacks stability, although it is superior in resolution, since in PEB the catalytic action of an acid generated by exposure is difficult to control. Especially in the case of the positive photoresist, if a basic gas such as ammonia gas or amine gas is present in the atmosphere between an exposure apparatus and a PEB apparatus, an acid generated by exposure reacts with this basic gas and is neutralized. Consequently, a portion which is supposed to dissolve in a developer becomes difficult to dissolve, i.e., a so-called hard dissolution phenomenon takes place. If this hard dissolution layer is formed, a so-called T-top phenomenon occurs in which a pattern formed by development is given a T shape having an overhang in the upper portion. This is a serious problem in a later stage such as etching. Unfortunately, a basic gas is often present in a clean room, and this is one cause of interfering with the use of the chemical amplification type photoresist. In other words, a substance (e.g., ammonia) acting as the generation source of a substance, which clouds an optical member and is produced on the surface of an optical member, makes the use of the chemical amplification type photoresist difficult.

Conventionally, an HEPA filter (High Efficiency Particulate Air Filter) for removing dust particles is used as a filter for air which is circulating in an illuminating optical apparatus. Also, U.S. Pat. No. 5,207,505 has disclosed a conventional apparatus which uses the fact that the decomposition of ammonium sulfate starts at about 120° C. and thereby avoids adhesion of ammonium sulfate by keeping an optical element (e.g., an elliptical mirror) above that temperature.

It is unfortunate that the HEPA filter is designed to remove particles, so the filter cannot remove impurities, such as ammonia (ammonium ions), sulfuric acid ions, and silicon oxide, which bring about the photo-chemical reaction described previously. In the method of holding an optical element at a predetermined temperature or higher, an elliptical mirror which is close to a large "heat source", i.e., a mercury lamp, can be relatively easily heated. However, an additional heat source is required for other optical elements. Accordingly, a heat exhaust method is a problem in an exposure apparatus for fabricating semiconductor devices requiring a particularly severe temperature control.

For these reasons, Japanese Laid-Open Patent Application No. 4-139453 and U.S. Pat. No. 5,166,530 have disclosed conventional apparatuses in which a light source and several optical elements are accommodated in a vessel and a gas from which ion particles are removed is supplied into this vessel, thereby preventing the clouding of these optical elements. Also, commonly-assigned U.S. patent application Ser. No. 083,287 (Jun. 29, 1993) has disclosed an apparatus which, in order to avoid the adhesion of ammonium sulfate $((NH_4)_2SO_4)$ or the formation of a hard dissolution layer in the chemical amplification type photoresist, removes ammonia or sulfuric acid ions in air circulating a chamber which accommodates an exposure apparatus by using a filter (so-called chemical filter) having a chemical adsorption mechanism.

FIG. 17 shows a schematic arrangement of a conventional exposure apparatus including an air-conditioning system. Referring to FIG. 17, a lamp box (housing) 201 containing a light source unit (including a mercury lamp, an elliptical mirror, and the like) is arranged outside a chamber 202 which accommodates an exposure apparatus main body (including an illuminating optical system and a projecting optical system) 207 and an air-conditioning system 203. Light emitted from the light source of the lamp box 201 is guided to the illuminating optical system (not shown) in the chamber 202 by mirrors and the like elements. The illuminating optical system illuminates a reticle R with this light. Light passing through the reticle R enters a projecting optical system PL, and the projecting optical system PL projects an image of a pattern on the reticle R onto a wafer.

The air-conditioning system 203 for supplying clean air to the main body 207 of the exposure apparatus is partitioned from the main body 207 in the chamber 202. The air-conditioning system 203 comprises a temperature controller 204, a fan 205, and a filter unit 206. The filter unit 206 comprises an HEPA filter 206a and a chemical filter 206b. The air-conditioning system 203 supplies air whose temperature is controlled by the temperature controller 204 to the main body 207 at a fixed wind speed by using the fan 205. From this temperature-controlled air, pollutants such as particles are removed by the HEPA filter 206a and chemical impurities such as ammonia and sulfuric acid ions are removed by the chemical filter 206b, with the result that a predetermined cleanliness is maintained. Note that each of the HEPA filter 206a and the chemical filter 206b is exchanged at predetermined intervals or whenever the predetermined cleanliness can no longer be maintained.

FIG. 18 is a sectional view of the conventional chemical filter used in the air-conditioning system in FIG. 17. In FIG. 18, active carbon is used as an adsorbing material of the chemical filter 206b, and this active carbon is chemically treated to increase the chemical impurity adsorption efficiency. Note that arrows 207 in FIG. 18 indicate air streams. When air containing chemical impurities passes through the chemical filter 206b, these chemical impurities are removed by the physical adsorption mechanism and the chemical adsorption (neutralization) mechanism of the active carbon inside the filter. Consequently, the air becomes chemically inert.

It is, however, known that optical elements constituting an illuminating optical system are clouded and the T-top phenomenon occurs in the chemical amplification type photoresist even if the impurity gas density is extremely low. In particular, only a few ppb of ammonia give rise to the T-top phenomenon, so it is necessary to decrease the density of ammonia to below 1 ppb. However, an average ammonia density in a clean room in which an exposure apparatus is installed is several ppb to several tens of ppb, and so presently commercially prepared chemical filters saturate in about a few months in the worst case. It is therefore necessary to periodically exchange the chemical filter.

The service life of a chemical filter, however, greatly depends upon the environment in which it is used. Additionally, the impurity density of air in a clean room in a semiconductor fabrication factory is not fixed but largely varies in accordance with the working conditions of the fabrication system, the contents of the process, the number of workers, the surrounding environment of the factory, and the season. For these reasons, the amount of impurities passing through the chemical filter varies even if the air supply quantity to the chemical filter is kept fixed.

To check the exchange timing of the chemical filter, it is possible to arrange a gas sensor downstream of the chemical filter and exchange the chemical filter when the gas density exceeds a predetermined value. Unfortunately, since the measurement capability of currently commercially available gas sensors is at most about 1 ppm (about 10 ppb even with an ammonia sensor), it is practically impossible to diagnose the service life of the chemical filter by using a gas sensor. Note that it is also possible to exchange the chemical filter before the service life is reached, but in this case the running cost of an exposure apparatus is increased.

Ion chromatography or gas chromatography is known as a method of measuring a low density of about 1 ppb. However, these methods require much time and cost to diagnose the service life of the chemical filter from the surrounding gas density of an exposure apparatus.

SUMMARY OF THE INVENTION

It is an object of the present invention to provide a gas cleaning apparatus capable of easily and accurately determining the service life of a filter unit for removing a chemical impurity from a gas.

It is another object of the present invention to provide an exposure apparatus capable of easily and accurately determining the service life of a filter unit for removing a chemical impurity from a gas.

It is still another object of the present invention to provide an exposure apparatus which does not essentially bring about the clouding of optical elements constituting an illuminating optical system or the T-top in a chemical amplification type photoresist.

A first gas cleaning apparatus according to the present invention comprises a filter unit for removing a chemical substance from a gas, a member arranged upstream of the filter unit in the flowing direction of the gas to adsorb the chemical substance, and a unit for measuring the amount of the adsorbed chemical substance and determining the service life of the filter unit on the basis of the measured substance amount.

A first exposure apparatus according to the present invention comprises a chamber including at least a portion of an illuminating optical system for irradiating a mask with illuminating light from a light source and a projecting optical system for projecting an image of a pattern of the mask onto a photosensitive substrate, an air-conditioner for circulating a gas (air) introduced into the chamber, a filter unit provided in at least one of an air circulation path in the chamber and an outer air inlet of the chamber to remove a chemical impurity from the air, a member arranged upstream of the filter unit in the flowing direction of the air to adsorb the chemical substance, and a unit for measuring the amount of the adsorbed chemical substance and determining the service life of the filter unit on the basis of the measured substance amount.

The chemical substance removed from a gas (air) is at least one of ammonia (including ammonium ions), an amine compound (including amine ions), sulfur oxide (including sulfurous acid ions and sulfuric acid ions), and silicon oxide (including silicon oxide ions). It is desirable that the measurement unit be constituted by a frequency detector for detecting the resonance frequency of the adsorbing member and an arithmetic unit for calculating the amount of the substance adsorbed by the adsorbing member on the basis of the output from the frequency detector. It is also desirable to further provide a filter for removing particles (dust particles) from a gas, and this filter is most preferably arranged at a gas exhaust port of the filter unit.

According to the first apparatus of the present invention, the filter unit removes a chemical impurity (ions or an organic gas) from a gas (air), and this clean gas from which the impurity is removed is supplied to an exposure apparatus for exposing a photosensitive substrate with an image of a pattern formed on a mask. In particular, in the exposure apparatus ammonium ions ($NH_4^+$) or silicon oxide ions ($SiO_4^{2-}$), which cause the cloudiness (cloud) of optical elements of an illuminating optical system for irradiating a mask with a light beam (e.g., i line or an excimer laser), or an organic gas as the generation source of these ions, is removed from air flowing into the chamber (or temperature-controlled air flowing into the chamber and supplied to the apparatus main body). This greatly reduces the ions or the organic gas flowing into the exposure apparatus (chamber), extraordinarily slowing the progress of the clouding of the optical elements. Also, when a chemical amplification type photoresist is used, a basic gas (e.g., ammonia) is removed, and this advantageously suppresses the generation of a T-top.

To determine the service life of the filter unit, it is possible to measure the density of an impurity gas contained in a gas passing through the filter. The service life of the filter unit mentioned herein means the timing at which the impurity gas density in the gas passing through the filter becomes, e.g., a few ppb or higher. In the case where ammonia is to be removed to suppress the T-top phenomenon, a timing at which the gas density after the passage through the filter is 1 ppb or higher can be considered as the service life of the filter. At present, ion chromatography is the only method by which ammonia densities around 1 ppb can be measured. Unfortunately, this method is impractical as the method of filter service life determination since it requires several hours as the sampling time and a high cost for one analysis cycle. This applies to other ions or an organic gas.

In contrast, in the present invention, the service life of the filter unit is determined from the amount of an impurity adhered to the adsorbing member provided upstream of the filter unit. This makes it possible to detect even a very small amount of a gas (low-density gas) with a high resolution (e.g., ppm order). Consequently, the service life of the filter unit can be determined more accurately than when the gas density is measured downstream of the filter unit. Also, this accurate service life determination for the filter unit achieves a reduction in the clouding of optical elements at a high efficiency even in a low-chemical-cleanliness environment. Furthermore, since it is unnecessary to exchange the filter unit earlier (before the service life is reached) for the sake of safety, the running cost also can be reduced. Additionally, by properly selecting the material or the like of the filter unit, it is possible to remove a very small amount of some other gas which can become a problem in the future.

When the service life of the filter unit is determined from the resonance frequency of the adsorbing member, cumbersome work of, e.g., sampling an impurity adhered to the adsorbing member is unnecessary. Also, the resonance frequency of the adsorbing member changes proportionally to the amount of an impurity passing through the filter unit. Accordingly, only by obtaining the change amount of the frequency by measuring the frequency constantly or at proper intervals, it is possible to determine the amount (integrated value) of an impurity flowing into the filter unit and consequently the service life of the filter unit.

Furthermore, when a dust removing filter is arranged at a gas exhaust port of the filter unit, fine dust components, such as metal particles, having an adverse effect on optical elements can be removed. It is also possible to remove dust particles which may be generated from the filter unit.

Also, when the filter unit (and the adsorbing member) is arranged at an outer air inlet of the chamber which houses an exposure apparatus for fabricating semiconductor devices such that the apparatus is isolated from the outer air, a chemical impurity (ions or an organic gas) contained in air introduced into the chamber is greatly reduced. This not only prevents the contamination (clouding) of optical elements but also reduces the reaction between amine gas and an exposed portion of a chemical amplification type positive resist on a wafer during exposure. Consequently, it is possible to prevent the surface of the chemical amplification type positive resist from hard dissolution and hence the T-top phenomenon of the resist pattern.

In a second gas cleaning apparatus of the present invention, a specific portion whose pollution removal capacity is lower than that of the rest is provided in a portion of a filter unit for removing a pollutant (chemical impurity) from a gas, and a unit for sensing the pollutant is arranged downstream of this specific portion.

A second exposure apparatus according to the present invention comprises a chamber for housing at least a portion of an illuminating optical system for irradiating a mask with illuminating light from a light source and a projecting optical system for projecting an image of a pattern of the mask onto a photosensitive substrate, an air-conditioner for circulating a gas (air) introduced into the chamber, and a filter unit provided in at least one of an air circulation path in the chamber and an outer air inlet of the chamber to remove a pollutant from the air. A specific portion whose pollution removal capacity is lower than that of the rest is provided in a portion of the filter unit, and a unit for sensing the pollutant is arranged downstream of this specific portion.

It is desirable that a load member be provided in the specific portion with a low pollution removal capacity of the filter unit to compensate for a pressure loss which is produced because the pollution removal capacity of the specific portion is decreased below that of the rest.

In the second apparatus of the present invention, the specific portion whose pollution removal capacity is lower than that of the rest is provided in a portion of the filter unit. Accordingly, when the semiconductor fabrication system is continuously used in a clean room in which the system is installed, this specific portion saturates earlier than the rest to pass a larger amount of a pollutant. Therefore, the unit for sensing the pollutant is arranged downstream of the specific portion in the filter unit to monitor the pollutant passing through the specific portion. This makes it possible to accurately and easily predict the service life of the entire filter unit. Consequently, the filter unit can be exchanged at an appropriate timing before the unit entirely saturates and breaks (before the service life is reached) and at which the unit is not wasted. Especially in an exposure apparatus which exposes a substrate coated with a chemical amplification type positive resist, the exchange timing of the filter unit for removing or inactivating an atmospheric basic substance (e.g., ammonia) is no longer missed, so this basic substance does not flow into the chamber (exposure apparatus) through the filter unit any longer. That is, it is possible to avoid the problem that the basic substance reacts with the positive resist, and thus, to prevent the problem of hard dissolution of the surface of the resist.

In the specific portion of the filter unit in which the pollution removal capacity is decreased below that of the rest, the aerodynamic load resistance (pressure loss) is relatively small, and this allows a larger amount of air than in the rest to flow into this specific portion. As a result, the specific portion of the filter unit acceleratedly saturates to reach the service life in some instances. If this is the case, it may be difficult to accurately predict the service life of the overall filter unit. In the present invention, however, the load member (e.g., a chemically inert filter) is provided to compensate for this pressure loss. Consequently, the exchange timing of the filter unit can be accurately predicted.

Note that the removal of a pollutant (chemical impurity) done by the filter unit of the present invention involves inactivation of the pollutant.

DETAILED DESCRIPTION OF THE PREFERRED EMBODIMENTS

Figure 1:
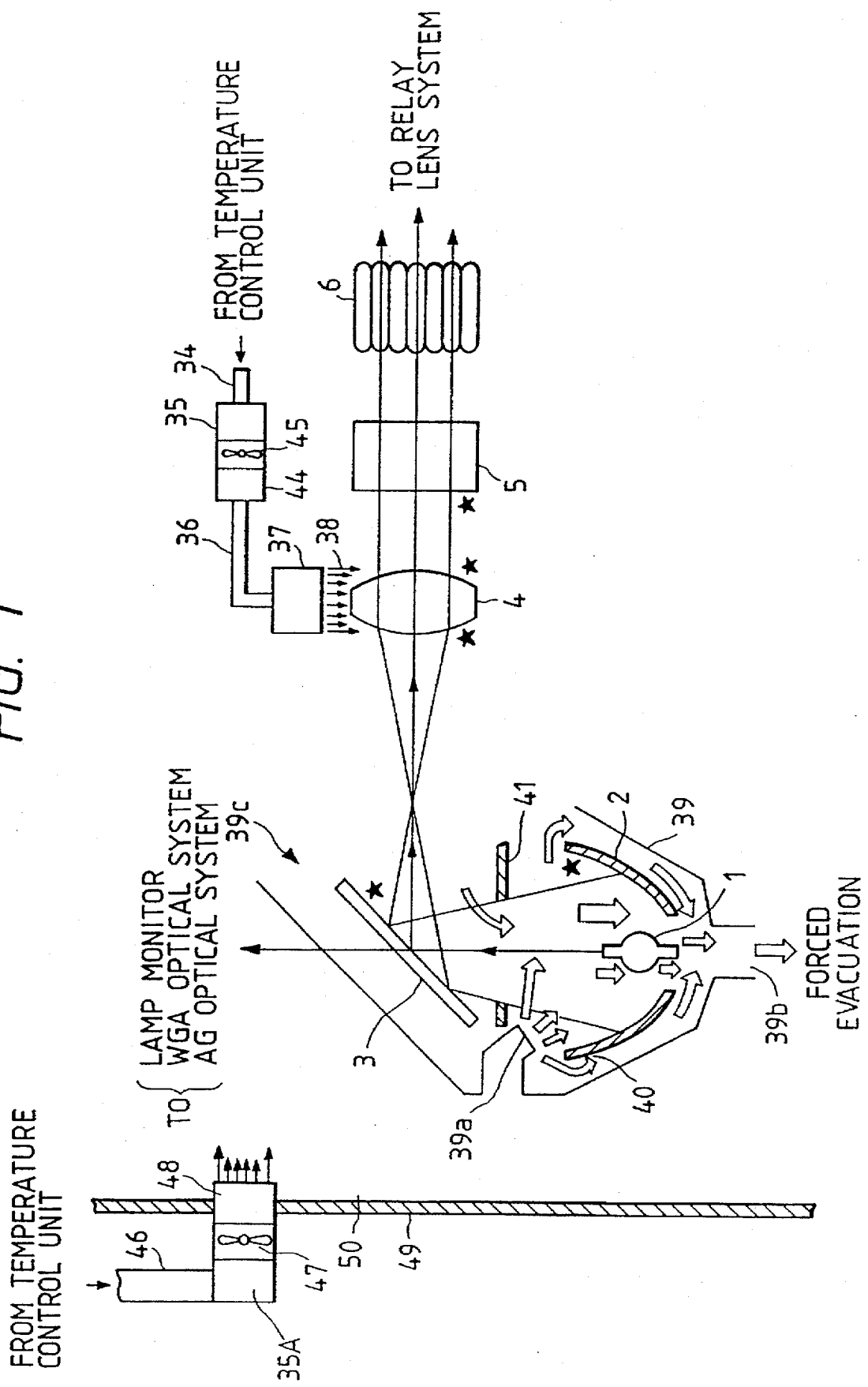
FIG. 1 is a view showing the arrangement of the major components of an illuminating optical system of an exposure apparatus according to a first embodiment of the present invention.
Figure 13:
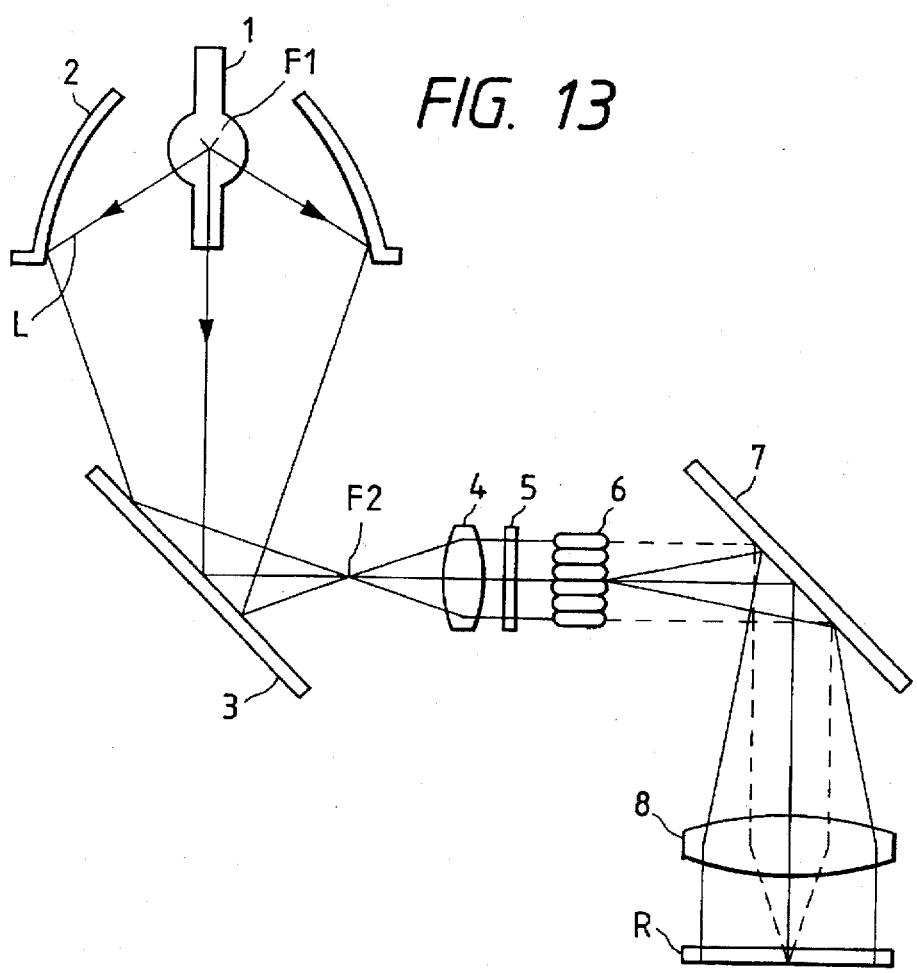
FIG. 13 is a schematic view showing the arrangement of an illuminating optical system used in a conventional exposure apparatus.
Figure 14:
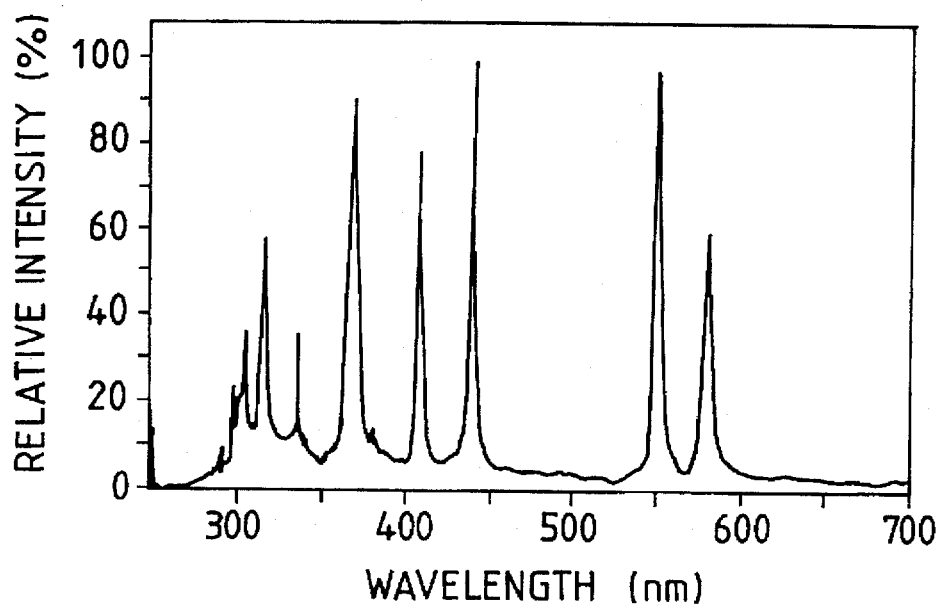
FIG. 14 is a graph showing the emission spectrum distribution of a super-high pressure mercury lamp.
Figure 16:
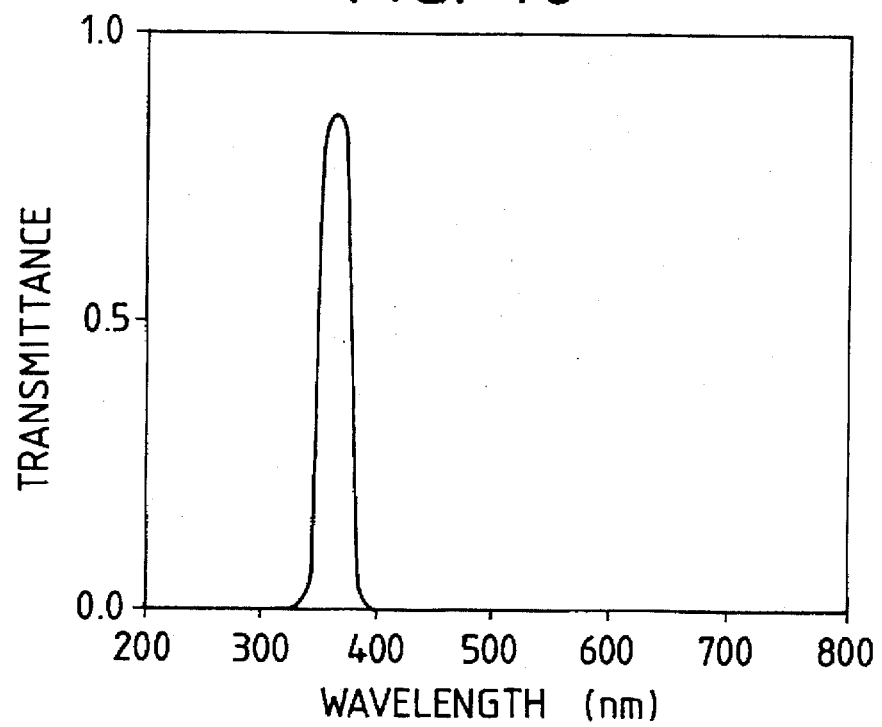
FIG. 16 is a graph showing the transmittance characteristic of a bandpass filter in FIG. 13.
Figure 15A:
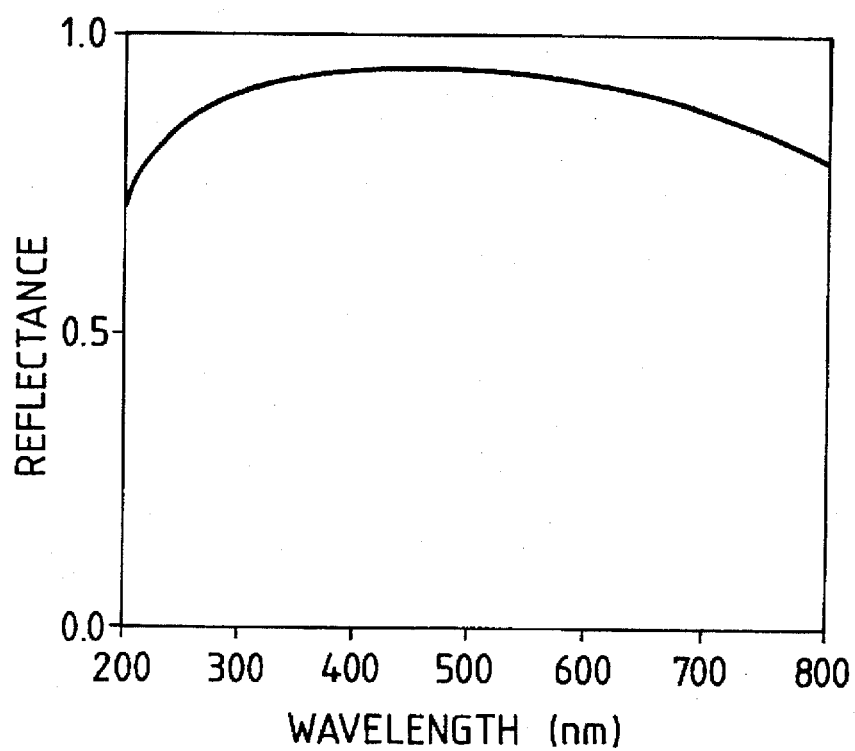
FIG. 15A is a graph showing the reflectance characteristic of a reflecting mirror on which aluminum is deposited.
Figure 15B:
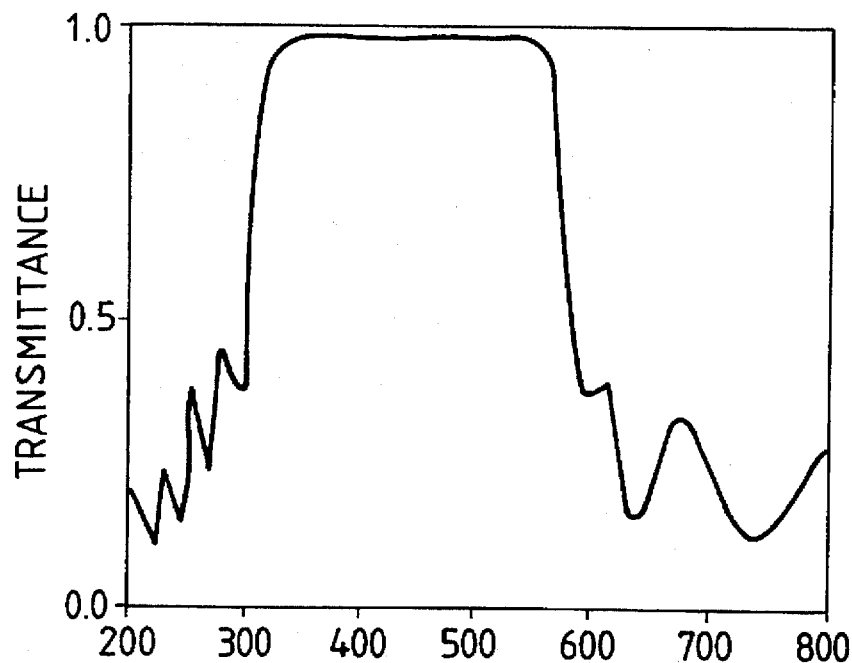
FIG. 15B is a graph showing the reflectance characteristic of a reflecting mirror on which a multilayered dielectric film is deposited.
Figure 17:
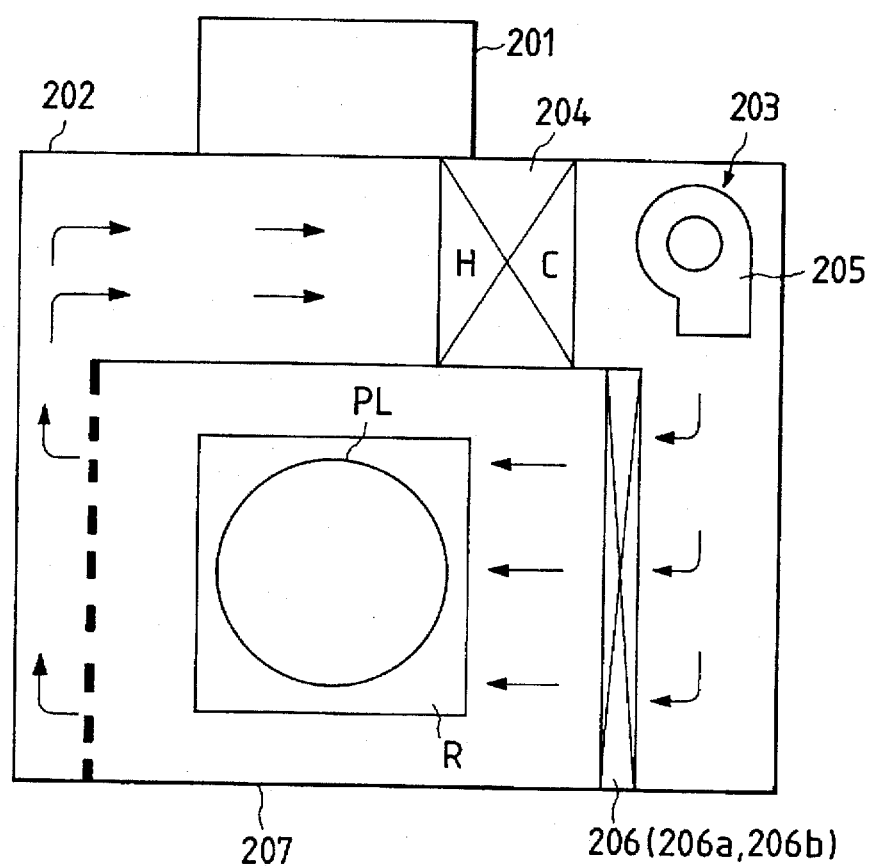
FIG. 17 is a schematic view showing the arrangement of a conventional exposure apparatus including an air-conditioning system.
Figure 18:
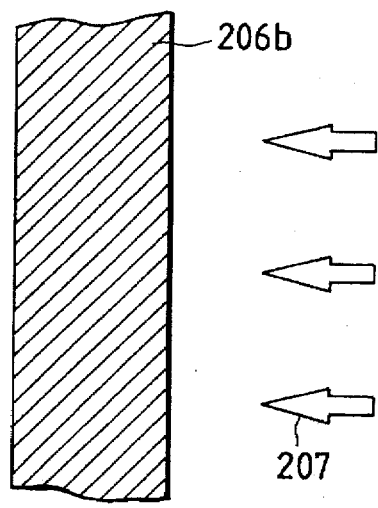
FIG. 18 is a sectional view showing a conventional chemical filter applied to the exposure apparatus in FIG. 17.

A filter unit (a gas cleaning apparatus) suitable for an exposure apparatus according to the first embodiment of the present invention will be described below with reference to FIGS. 1, 3A, and 3B. In this embodiment, the present invention is applied to an illuminating optical apparatus constituting a projection exposure apparatus for fabricating semiconductor devices. FIG. 1 shows a schematic arrangement of an optical system of the illuminating optical apparatus according to this embodiment, which uses a super-high pressure mercury lamp as a light source. In FIG. 1, the same reference numerals as in FIG. 13 denote parts having the same functions or operations.

Referring to FIG. 1, light emitted from a mercury lamp 1 arranged at the first focal point of an elliptical mirror 2 is reflected by the inner surface (a reflecting surface on which aluminum or a multilayered dielectric film is deposited) of the elliptical mirror 2 and propagates toward a mirror 3 for deflecting an optical path. In this embodiment, the mirror 3 is a dichroic mirror which reflects ultraviolet light and passes visible light or infrared light. The light (ultraviolet light) reflected by the mirror 3 is focused on the second focal point of the elliptical mirror 2 and enters an input lens 4. The input lens 4 converts the divergent light from the second focal point (light source image) into a bundle of nearly parallel rays and inputs this bundle of rays to a bandpass filter (wavelength selecting element) 5. An interference filter, for example, is used as the bandpass filter 5.

The bandpass filter 5 selects light having a specific wavelength, e.g., i line at a wavelength of 365 nm, from the light (ultraviolet light) from the mercury lamp 1, so only this illuminating light (i line) selected by the bandpass filter 5 is incident on a fly-eye lens 6. The focal plane on the back side (reticle side) of the fly-eye lens 6 is so arranged as to essentially have a Fourier transform relationship with the pattern surface of a reticle. Also, the fly-eye lens 6 forms a large number of light source images (secondary light sources) on this back side focal plane. Individual light components from the secondary light source images formed by the fly-eye lens 6 are incident on a relay lens system (not shown). This relay lens system is arranged between the fly-eye lens 6 and the condenser lens 8 in FIG. 13, and produces an essentially conjugate plane of the pattern surface of a reticle.

Although not shown, the light (visible light and infrared light) passing through the lens 3 is guided to a lamp monitor, a wafer global alignment (WGA) optical system, and an auto-focus (AF) optical system. The lamp monitor is a photoelectric converter for monitoring the emitted light amount of the mercury lamp 1. The WGA optical system is an optical system for performing global alignment for a wafer onto which the pattern of a reticle is projected. The AF optical system is an optical system for obliquely irradiating detection light, to which the photoresist is not photosensitive, onto a wafer, and thereby detecting the focus position of the wafer.

Note that the surfaces indicated by symbol ★ in FIG. 1, i.e., the inner surface of the elliptical mirror 2, the reflecting surface of the mirror 3, both surfaces of the input lens 4, and the incident surface of the bandpass filter 5, are clouded when no countermeasure against clouding is taken. No noticeable clouding has occurred in the optical elements closer to the reticle than the bandpass filter 5. From this, it can be assumed that the clouding is a photo-chemical reaction involving light having a wavelength of less than 365 nm.

In this embodiment, air curtains made of chemically clean air are formed for the individual optical elements from the elliptical mirror 2 to the bandpass filter, excluding the elliptical mirror 2, on which the cloud phenomenon takes place, thereby shielding and isolating the optical elements from an atmosphere with a low chemical cleanliness. Chemically clean air is the air from which a substance, particularly an ammonia ion (or ammonia) or sulfuric acid ion, which produces the cloud on an optical element, is removed by using an impurity removal filter called a chemical filter, and a substance such as organic silanol is removed by a physical adsorption mechanism.

If generation of dust is particularly problematic, as the method of passing air through a chemical filter, it is possible to unite the chemical filter, an HEPA filter (or a ULPA filter) for dust removal, and a fan for air supply. In this case, it is desirable to uniformize the air stream all over the surface of the chemical filter in order to efficiently use the chemical filter. The HEPA filter can be removed from the arrangement if the cleanliness concerning particles (dust particles) of the air passing through the chemical filter is of no problem or if the amount of dust in the primary air, the chemical filter, and the fan is so small as to be negligible. The fan can also be removed from the above arrangement if the primary air has a sufficient positive pressure or the secondary side has a sufficient negative pressure.

The air curtain of chemically clean air can be formed for each individual optical element, or a wide air curtain can be formed for a plurality of adjacent optical elements. In FIG. 1, the air curtain is formed only for the input lens 4, and mechanisms for forming air curtains for the other optical elements are omitted.

In this embodiment, as illustrated in FIG. 1, temperature-controlled air supplied from a temperature control unit (not shown) is guided to a filter unit 35 mounting a chemical filter 42 (see FIG. 2) through a pipe 34. Clean air from which an impurity is removed by the filter unit 35 is guided to a blow opening 37 for forming an air curtain 38 by a fan 45, an HEPA filter 44, and a pipe 36. The blow opening 37 blows the clean air around the input lens 4. This blow opening 37 is arranged so as not to interfere with the illuminating optical path.

That is, in this embodiment the HEPA filter 44 is arranged downstream of the filter unit 35. In addition, the fan 45 is arranged in front of (upstream of) this HEPA filter 44 because the HEPA filter 44 produces a large pressure loss. Note, as described above, that the HEPA filter can be removed from this arrangement if the cleanliness concerning particles (dust particles) of the air passing through the chemical filter 42 does not pose a problem or if the amount of dust in the primary air, the chemical filter 42, and the fan 45 is so small as to be negligible. Also, the fan 45 can be removed from the arrangement if the primary air has a sufficient positive pressure or the secondary side has a sufficient negative pressure.

Note, however, that the cleanliness requirement of the exposure apparatus is severe, so normally the HEPA filter 44 is used. Therefore, the primary air is supplied under pressure to the secondary by, e.g., the fan 45 by taking into account the pressure loss by the HEPA filter 44. In this case, it is necessary to carefully choose the material of the pipe 36 or the like in order that no impurity mixes from the piping into the air passing through the HEPA filter. Also, it is desirable to draw the secondary air as little as possible.

To suppress the generation of ions which cause the clouding of optical elements, it is possible to change the materials of the holding member and the shielding member as the sources of generation and to flow a high-purity nitrogen gas ($N_2$), instead of air, in order to minimize the effect of oxygen ($O_2$). Since, however, flowing nitrogen ($N_2$) gas into the illuminating optical system requires a considerable amount of nitrogen ($N_2$), a thorough evacuation control of the illuminating optical apparatus is necessary.

Furthermore, in this embodiment, a duct 39 is attached to the illuminating optical system so as to cover the mercury lamp 1, the elliptical mirror 2, and the mirror 3. A blow opening 39a of the duct 39 near the end portion of the elliptical mirror 2 supplies an air stream for cooling the mercury lamp 1 through a sirocco fan or the like member. This air stream 40 is forcedly evacuated from an exhaust port 39b of the duct 39 in the bottom portion of the elliptical mirror 2. A partition 41 having a hole for passing light from the mercury lamp 1 is fixed in the duct 39 between the elliptical mirror 2 and the mirror 3. The air flowing from an opening 39c of the duct 39 on the input lens 4 side is forcedly exhausted from the exhaust port 39b through the hole of the partition 41. The light for the lamp monitor, the WGA optical system, and the AF optical system, which has been transmitted through the mirror 3, is extracted to the outside through a transmission window of the duct 39.

In this arrangement, an air curtain is difficult to form around the elliptical mirror 2, since the elliptical mirror 2 is irradiated with heat from the mercury lamp 1 and a large amount of the cooling air stream 40 is present near the elliptical mirror 2. Therefore, the adhesion of ammonium sulfate to the elliptical mirror 2 is prevented by temperature control. As disclosed in U.S. Pat. No. 5,207,505, the temperature control for avoiding the adhesion of ammonium sulfate (($NH_4)_2SO_4$) to an optical element is the method of keeping the optical element at 120° C. or higher by using the fact that the decomposition of ammonium sulfate starts at about 120° C. It is relatively readily possible to heat the elliptical mirror 2 in the vicinity of the mercury lamp 1 which is a large heat source.

Figure 2:
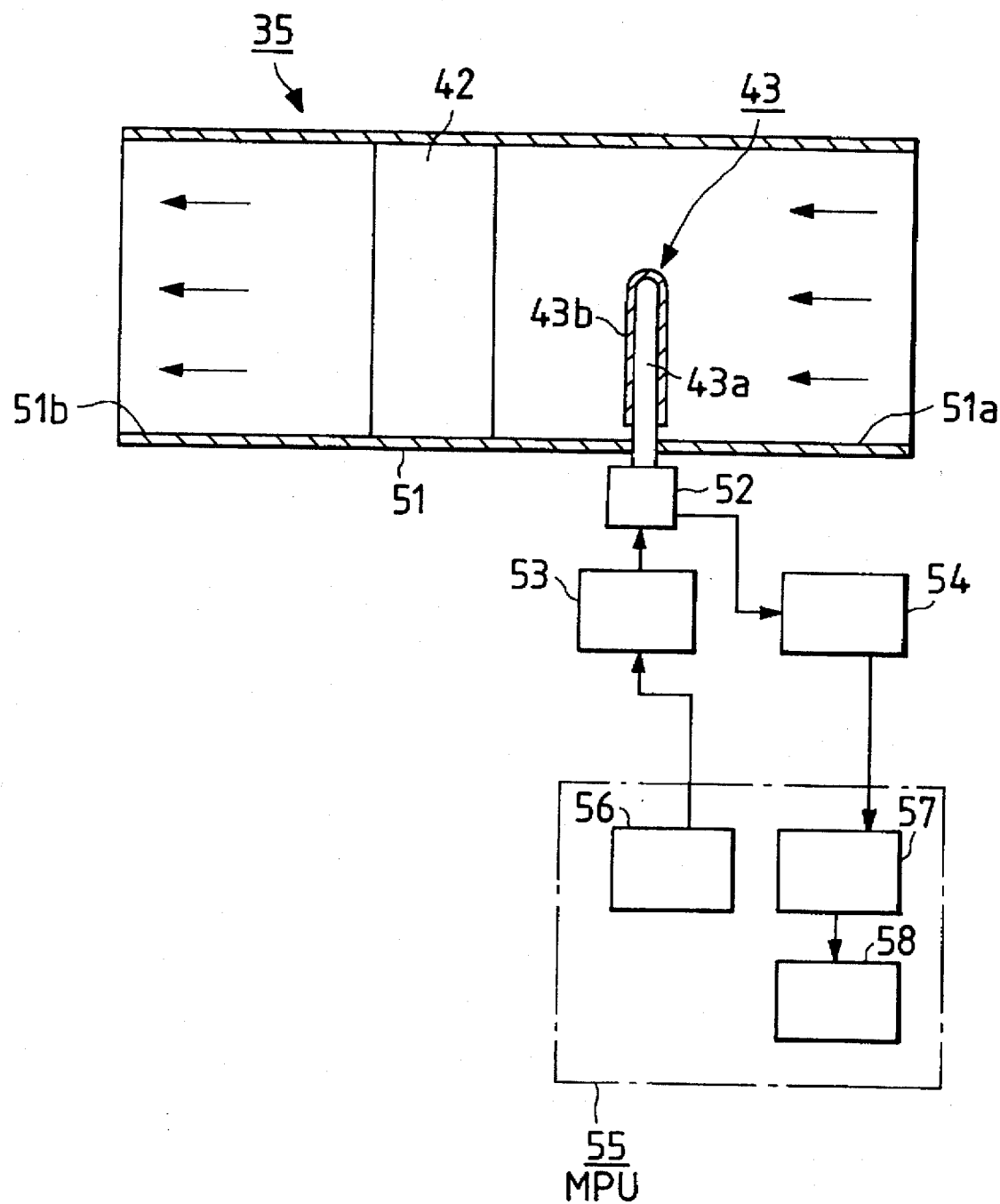
FIG. 2 is a view showing the interior of a filter unit in FIG. 1 and a signal processing system for the filter unit.

FIG. 2 is a schematic view showing the internal structure of the filter unit 35 in FIG. 1 in an enlarged scale. In FIG. 2, the chemical filter 42 is fixed in nearly the middle of a cylindrical casing 51 having an upstream casing portion 51a and a downstream casing portion 51b. A gas sensor 43 for measuring the total flow rate of a predetermined substance in a fluid gas is arranged in the casing portion 51a upstream of the chemical filter 42. This gas sensor 43 comprises a quartz oscillator (AT cut type) 43a and an adsorption film 43b coated on the surface of the quartz oscillator 43a. A transducer 52 is attached to one end of the quartz oscillator 43a. This transducer 52 comprises electrode plates sandwiching the quartz oscillator 43a and a converter (including a voice coil motor) for converting the oscillation of the quartz oscillator 43a into an electrical signal. In accordance with a start signal from a controller 56 in a microprocessor (MPU) 55, a driver 53 gives a wide-frequency oscillation to the quartz oscillator 43a via the transducer 52. A frequency measurement unit 54 analyzes the electrical signal from the transducer 52, obtains the resonance frequency of the quartz oscillator 43a and the adsorption film 43b, and supplies this resonance frequency to an arithmetic unit 57 in the microprocessor 55. The arithmetic unit 57 calculates a change amount $\Delta F$ by subtracting the initial resonance frequency (immediately after exchange of the chemical filter 42) from the supplied resonance frequency and informs a determination unit 58 of this change amount $\Delta F$. On the basis of this change amount $\Delta F$, the determination unit 58 determines whether the service life of the chemical filter 42 has been reached. Note that the arrows in FIG. 2 indicate the flowing direction of a gas (air).

The operation of the gas sensor 43 arranged upstream of the chemical filter 42 will be described below.

The surface of the quartz oscillator 43a of the gas sensor 43 is covered with the adsorption film 43b. As this adsorption film 43b, an optimum material is selected in accordance with a gas to be adsorbed. When a gas is adsorbed by the adsorption film 43b, the adsorption film 43b changes its mass, and the resonance frequency changes accordingly as represented by the following equation:

variation in resonance frequency:

$$dF = -2 \cdot F_0^2 \cdot \Delta M / (v \cdot S \cdot \rho) \quad (3)$$

where $F_0$ is a fundamental resonance frequency, $v$ is a bulk transverse wave velocity (3,320 [m/s]) which propagates in the direction of thickness of the quartz oscillator, $S$ is an electrode area, $\rho$ is the density ($2.65 \times 10^3$ [Kg/m$^3$]) of quartz, and $\Delta M$ is a change amount of the mass of the adsorption film 43b.

A detailed description will be made by taking ammonia as an example of a gas to be adsorbed. In this case, a polymer film is used as the base of the adsorption film 43b for covering the surface of the quartz oscillator 43a. This polymer film is formed on the surface of the gas sensor by using an LB technique. The LB technique is short for a Langmuir-Blodgett technique for forming a thin film consisting of a layer of a single molecule or several molecules. As the film formation material, a substance capable of fixing a sensor substance, which reacts with a target gas, in a porous polymer film and holding the reaction product in the film is chosen. As the polymer material, a substance capable of being formed into a very thin film is desirable. One representative example is cellulose. The sensor substance is selected from, e.g., phosphoric acid ($H_3PO_4$) and potassium permanganate ($KM_nO_4$).

Ammonia (including ammonium ions) in an environmental gas causes a-neutralization reaction with phosphoric acid in the adsorption film 43b on the quartz oscillator 43a and is fixed on the adsorption film 43b. Since the neutralized ammonia is not eliminated, ammonia in an amount proportional to the total ammonia amount passing through the chemical filter 42 is continuously adsorbed on the surface of the adsorption film $_{43}b$ of the gas sensor 43.

The function of the chemical filter 42 in FIG. 2 will be described below.

Figure 3A:
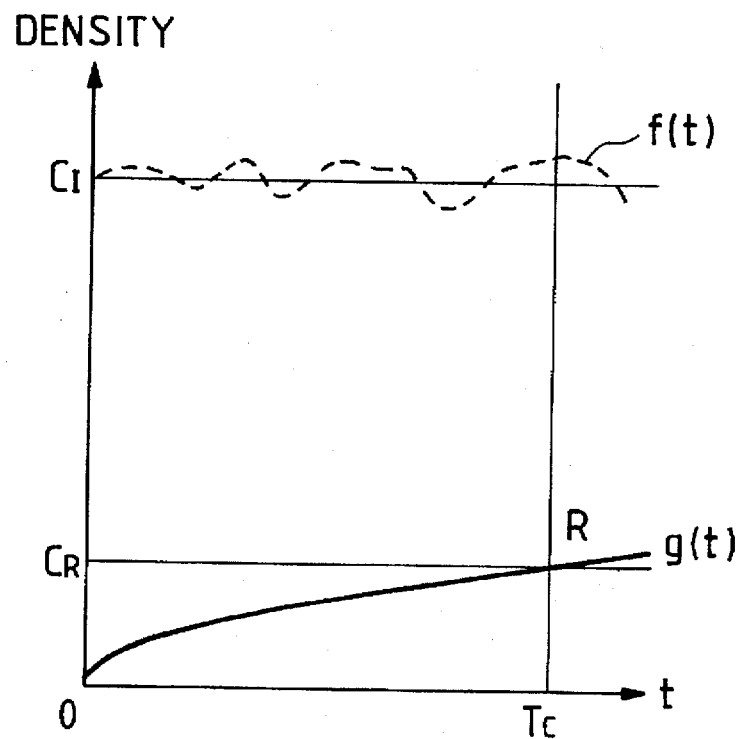
FIG. 3A is a graph showing ammonia densities at the inlet and outlet (upstream and downstream) of a chemical filter using active carbon or the like material.
Figure 3B:
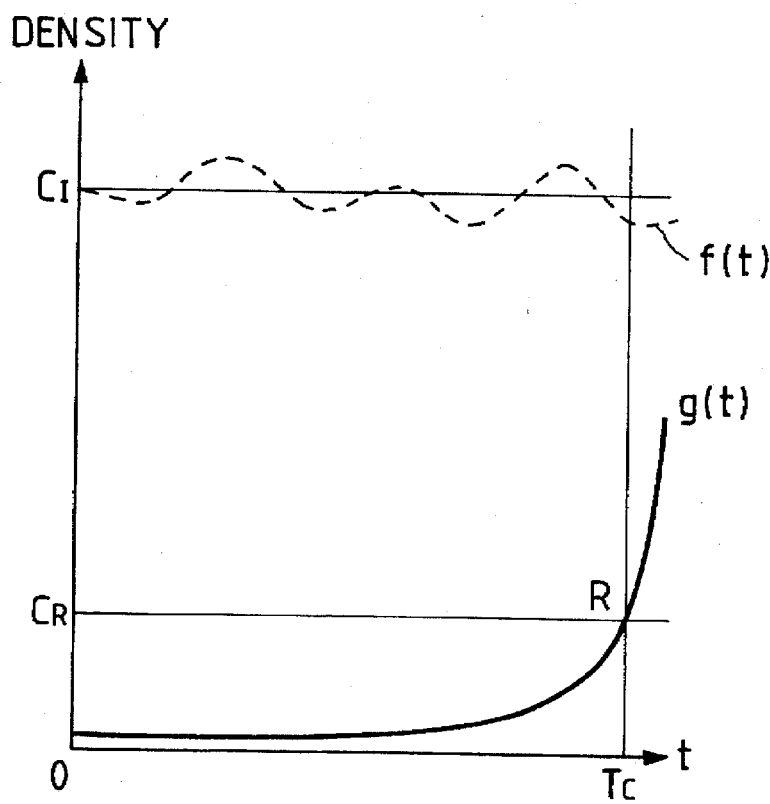
FIG. 3B is a graph showing ammonia densities at the inlet and outlet of a chemical filter using ion exchange fibers or the like material.

FIGS. 3A and 3B are graphs showing the ammonia densities at the inlet and outlet (upstream and downstream) of the chemical filter 42. FIG. 3A shows the experiment in which ammonia is primarily adsorbed by a physical adsorption mechanism of a chemical filter using, e.g., active carbon. FIG. 3B shows the experiment in which ammonia is primarily adsorbed by a chemical adsorption mechanism of a chemical filter using, e.g., ion exchange carbon. Note that in FIGS. 3A and 3B, time is plotted along the abscissa and the ammonia density is plotted along the ordinate.

In each of FIGS. 3A and 3B, a curve f(t) indicates the upstream density and a curve g(t) indicates the downstream density. Although the upstream curve f(t) actually varies as indicated by the broken line, the average value is calculated as $C_1$ for the sake of convenience.

Assuming that the filter breaking density on the downstream side (the downstream density as the determination reference of the service life of the filter) is $C_R$, time $T_c$ at an intersection R of straight line $Y = C_R$ and curve $Y = g(t)$ is the filter service life. The following equation is established assuming that the total ammonia amount until the filter breaking time is Q:

$$Q = \int f(t) dt = C_1 \cdot T_c \quad (4)$$

Unfortunately, $C_1$ is generally difficult to determine because f(t) largely varies in accordance with, e.g., the environmental conditions of a clean room or the seasonal factors.

In this embodiment, however, the gas sensor 43 is arranged upstream of the chemical filter 42. The integrated value of a change dF of the resonance frequency of this gas sensor 43 is proportional to the total ammonia amount Q. Accordingly, a shift $F_R$ (to be referred to as a "breaking frequency" hereinafter) of the initial value of the resonance frequency of the gas sensor 43 upon filter breaking is represented by the following equation:

$$F_R = \int dF = \alpha \cdot Q \quad (5)$$

where $\alpha$ is a coefficient determined by the air amount, the installation conditions, or the like factor, and Q is an intrinsic amount of the chemical filter. Both $\alpha$ and Q are experimentally determinable.

A method of determination using the experiments will be described in more detail below. If the experimental system differs from an actual system, the upstream ammonia density is artificially held nearly constant by using a permeator or a standard ammonia gas (note that at an extremely high density it is necessary to reduce to about several tens of ppb since the reaction mechanism of the chemical filter changes), and the upstream and downstream densities of the chemical filter are measured using an ion chromatograph. The service life $T_c$ is calculated by obtaining changes of these densities with time, and the total ammonia density Q is determined according to equation (4) shown above. This experimental system must be hydrodynamically analogous to a system to be used in practice. If the experimental system is identical to an actual system, it is only necessary to directly measure the coefficient a and the breaking frequency $F_R$ by actually installing the gas sensor.

The values of the total ammonia amount Q, the coefficient $\alpha$, and the breaking frequency $F_R$ obtained up to the filter breaking are stored in the determination unit 58 (FIG. 2).

In an actual operation, the frequency measurement unit 54 measures the resonance frequency of the quartz oscillator 43a of the gas sensor 43 constantly or as needed, and transmits the measured value to the arithmetic unit 57. The arithmetic unit 57 subtracts the initial resonance frequency from this supplied frequency to obtain the change $\Delta F$ in frequency. This is equivalent to obtaining the amount of a substance adsorbed by the adsorption film 43b by using equation (3). If this change $\Delta F$ reaches the breaking frequency $F_R$ before filter breaking, which is previously stored, the determination unit 58 determines that the service life of the chemical filter 42 is reached. Note that it is also possible to actually calculate the amount $\Delta M$ of the adsorbed substance in accordance with equation (3) by using the arithmetic unit 57, and perform the service life determination by the determination unit 58 on the basis of this amount $\Delta M$.

What is important here is that the ammonia density in a common clean room is about several tens of ppb, and so any detachable gas sensor cannot sense the ammonia density.

To solve this problem, in this embodiment the adsorption film 43b of the gas sensor 43 is given the property of adsorbing and fixing a passing gas. This makes a calculation of the ammonia passing amount feasible. As described above, by installing the gas sensor 43 of integral type upstream of the chemical filter 42, it is possible to determine the service life of the chemical filter used in various environments.

Also, the service lives of chemical filters for impurities (e.g., sulfuric acid ions and organic silanol) other than ammonia can be calculated in the same way as above. Note, however, it is necessary to select the most effective one of substances capable of adsorbing and fixing a gas to be treated, as the adsorption film (sensor substance) of the gas sensor. Accordingly, if a plurality of chemical impurities are present in a clean room (atmosphere) in which an exposure apparatus is installed, gas sensors each having an adsorption film (sensor substance) effective to a corresponding one of these impurities are provided. On the basis of the individual resonance frequencies of these gas sensors, the service life of the chemical filter is determined for each impurity. If a single common chemical filter is provided for a plurality of impurities, this chemical filter is exchanged immediately after the service life of the chemical filter is reached with respect to One impurity. If a plurality of chemical filters are provided in a one-to-one correspondence with a plurality of impurities, these chemical filters are exchanged by individually determining their service lives. Also, if a single common chemical filter is provided for a plurality of impurities, only a gas sensor effective to an impurity by which the service life of the chemical filter is reached earliest can be provided. In this case, the service life of the chemical filter is determined on the basis of the resonance frequency of this gas sensor, and the chemical filter is exchanged at the time the service life of the chemical filter is reached with respect to that impurity.

As the sensor substance for ammonia, zinc chloride ($ZnCl_2$) can also be used in addition to phosphoric acid mentioned earlier. Also, as the sensor substance for sulfuric acid, it is possible to use, e.g., potassium hydroxide (KOH) or calcium hydroxide ($Ca(OH)_2$).

In FIG. 1, an air curtain is formed for each of the optical elements in the illuminating optical system, and the chemical filter is provided at the outer air inlet of the chamber for accommodating the exposure apparatus. With this arrangement, chemical impurities are removed from air in a clean room in which the chamber is installed, and the resultant clean air is introduced into the chamber.

Referring to FIG. 1, the air taken from the outer atmosphere (clean room) and controlled at a predetermined temperature by the temperature control unit (not shown) is introduced to the fan 47 via a circulation pipe 46 and a filter unit 35A. The pressure of the temperature-controlled air is raised by the fan 47, and this air is supplied into a chamber room 50, surrounded by a chamber wall 49, through an HEPA filter 48. Most of clean air passing through the filter unit 35A and the HEPA filter 48 is returned to the temperature control unit through a predetermined circulation path in the chamber room 50. However, a portion of the clean air is blown to the outside from a gap in the side wall of the chamber room 50. The filter unit 35A is a large-capacity filter unit having the same function as the filter unit 35.

By introducing or circulating the clean air, from which impurities are removed by the filter unit 35A and the HEPA filter 48, in the chamber room 50, not only contamination (clouding) of the optical elements in the exposure apparatus can be prevented but ions and an organic gas (e.g., amine gas) in the chamber room 50 are reduced. Consequently, the reaction between the amine gas and the chemical amplification type resist on a wafer during exposure is also reduced. This makes it possible to prevent the problem of hard dissolution of the chemical amplification type resist and hence to protect the resist pattern from a T-top phenomenon.

Details of the chemical filter 42 in FIG. 2 will be described below.

As the above-mentioned chemical filter for removing ions, it is possible to use an ion exchange resin or an ion exchange fiber. The ion exchange fiber is preferred for a gas treatment since the ion exchange fiber has a large surface area and a high reaction speed and can be readily molded and processed. The ion exchange fiber is manufactured by, e.g., radiation-induced graft polymerization from a polypropylene fiber. There are two types of the ion exchange fiber, i.e., an acidic cation exchange fiber and a basic anion exchange fiber, so these fibers are selectively used in accordance with the polarity of ion of interest. In this embodiment, filters of both types are used; that is, a filter of the former type is used to adsorb positive ions, such as ammonium ions ($NH_4^+$) and amine, and a basic gas, and a filter of the latter type is used to adsorb negative ions, such as sulfuric acid ions ($SO_4^{2-}$) and nitrogen oxide ($NO_x$), and an acidic gas. For example, approximately 90% or more of ammonium ions ($NH_4^+$) can be adsorbed even at low densities by the neutralization reaction with a strongly acidic cation exchange fiber. Negative ions are adsorbed by the neutralization reaction with a basic anion exchange fiber. These ion exchange fibers are exclusively used for the purpose of removing ionic impurities, so they are not suitable for removal of organic substances.

An active carbon filter is basically effective for almost all impurities. Generally, however, the active carbon filter has higher adsorptivity for an organic impurity having a larger molecular size, a larger intermolecular force, a lower solubility in water, and a lower polarity. Therefore, the active carbon filter is effective to remove an organic substance, e.g., organic silane such as trimethylsilanol or HMDS (hexamethyldisiloxane), which cannot be completely removed by the ion exchange resin. In choosing the active carbon filter, it is necessary to take into consideration the surface area and the average pore size of active carbon and also the shape and the dust generation properties of active carbon.

In this embodiment, it is desirable to use any of a sheet formed by impregnating urethane fibers with active carbon, active carbon fibers in the form of a sheet, and honeycomb active carbon, when the pressure loss of the apparatus is taken into account. Active carbon added with an acidic substance or a weak alkali substance is also effective to remove an ionic impurity. Like active carbon, zeolite is effective for nearly all impurities, and the pore size of zeolite is selected in accordance with the size of an impurity to be removed.

In this embodiment as described above, the material of the chemical filter need only be chosen in accordance with the type of impurity in air. Also, a chemical filter made from active carbon or zeolite can remove even an ionic substance and an organic substance to a certain degree. However, the pore size of a chemical filter of this sort is determined to meet the molecular size of an impurity to be removed, in order to increase the removal efficiency of the filter. Therefore, it is also possible to make a chemical filter by combining a filter made from at least one type of ion exchange fibers and a filter made from active carbon or zeolite. In this case, the former filter is assigned with the role of removing ionic substances, and the latter filter is assigned with the role of removing organic substances.

Note that this embodiment is effective not only for various exposure apparatuses but also for all optical apparatuses using ultraviolet radiation, such as a projection exposure apparatus and proximity- and contact-type exposure apparatuses, and to illuminating optical apparatuses of these exposure apparatuses.

Figure 4:
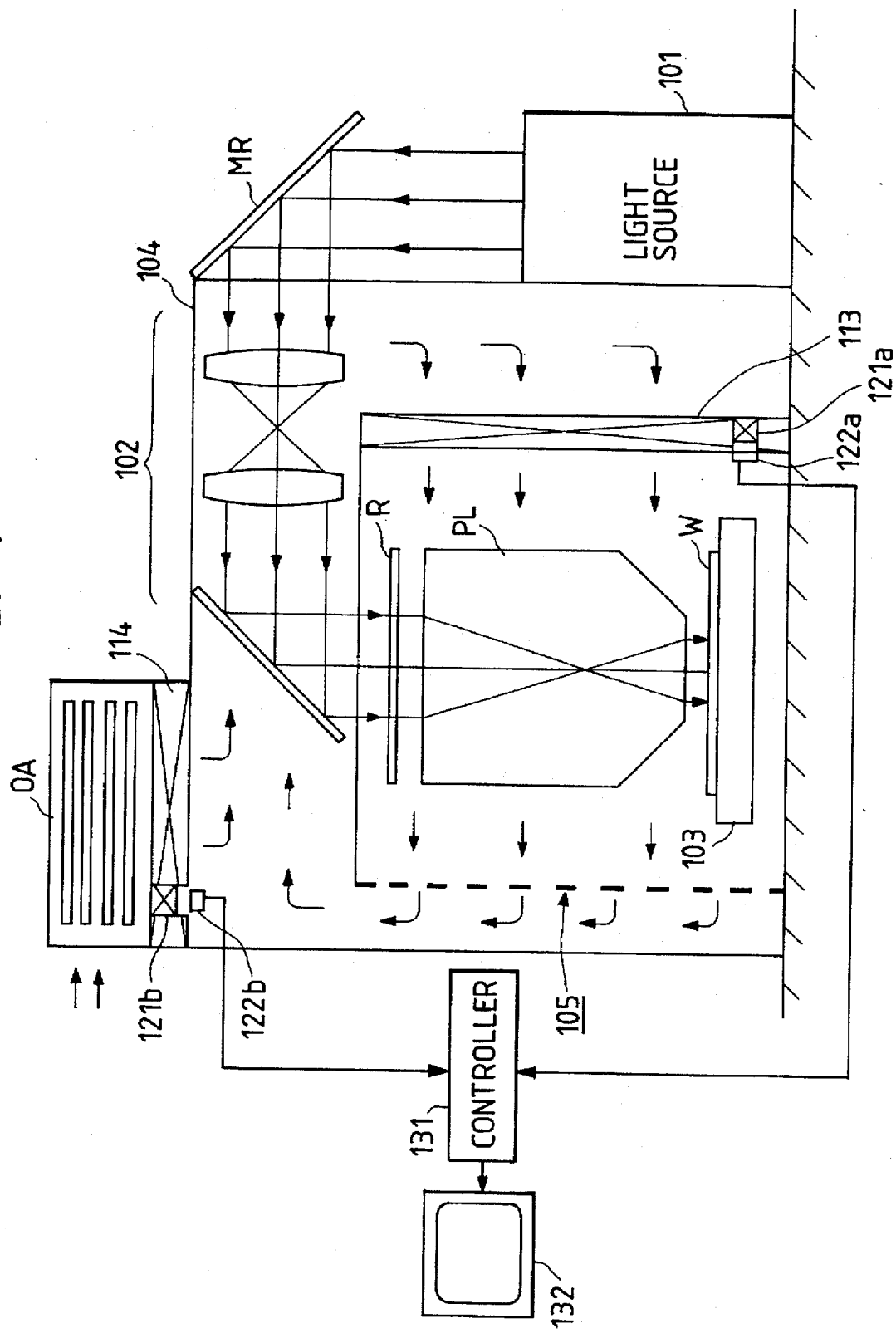
FIG. 4 is a schematic view showing the overall arrangement of an exposure apparatus according to a second embodiment of the present invention.
Figure 5:
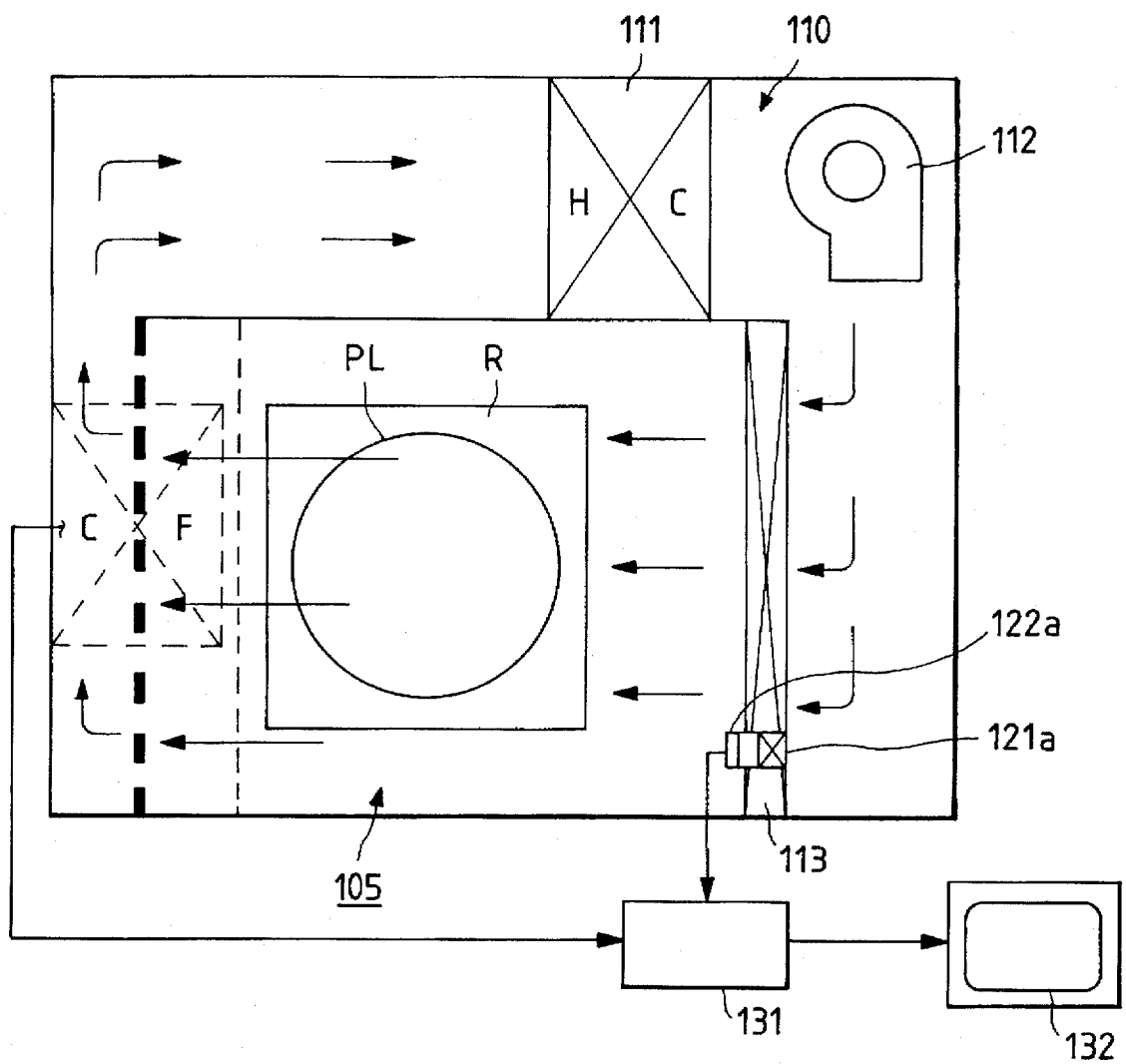
FIG. 5 is a plan view of the exposure apparatus in FIG. 4.

The second embodiment of the present invention will be described below with reference to FIGS. 4 to 12. FIG. 4 is a side view showing a schematic arrangement of an exposure apparatus including a laser light source according to this embodiment. FIG. 5 is a plan view showing the exposure apparatus in FIG. 4 viewed from above. Note that for the sake of an easy understanding of the present invention, the light source and the illuminating optical system in FIG. 1 are omitted from FIG. 4.

Referring to FIG. 4, a KrF or ArF excimer laser, or a four- or five-fold harmonic (to be referred to as DUV light hereinafter) of a YAG laser, emitted from a light source 101 is incident on an illuminating optical system 102. The illuminating optical system 102 uniformly illuminates a reticle R with the DUV light. Although not shown, the illuminating optical system 102 consists of a beam shaping optical system, an optical integrator (fly-eye lens), an aperture stop, a relay lens, a field stop (reticle blind), a condenser lens, and the like. Practical arrangements of the illuminating optical system 102 are disclosed in, e.g., U.S. Pat. Nos. 5,253,110 and 5,307,207. The light passing through the reticle R is incident on a projecting optical system PL which is telecentric on both sides. The projecting optical system PL projects an image of a pattern on the reticle R onto a wafer W placed on an XY stage 103. In this embodiment, assume that a chemical amplification type photoresist is coated on the wafer W.

The illuminating optical system 102, the reticle R, the projecting optical system PL, and the XY stage 103 are accommodated in a chamber 104 in which air whose temperature is controlled by an air-conditioning system 110 (see FIG. 5) is circulated. The light source 101 is arranged outside the chamber 104, and the DUV light from the light source 101 is guided to the illuminating optical system 102 in the chamber 104 by a mirror MR. Referring to FIG. 4, an apparatus main body including the reticle R, the projecting optical system PL, and the XY stage 103 is installed in a chamber 105, and a first filter unit 113 is attached to the overall surface of an inlet port of the chamber 105.

As illustrated in FIG. 5, the air-conditioning system 110 is constituted by a temperature controller 111 and a fan 112 arranged in an air circulation path in the chamber 104. Air which is set at a predetermined temperature by the temperature controller 111 and supplied from the fan 112 is supplied to the chamber 105 through the first filter unit 113.

In FIG. 4, a second filter unit 114 is arranged at an outer air inlet OA of the chamber 104. Each of the first and second filters 113 and 114 consists of an HEPA filter (or a ULPA filter) for removing physical pollutants such as particles and a chemical filter for removing chemical pollutants such as ammonia.

In the exposure apparatus shown in FIGS. 4 and 5, outer air taken from the outer air inlet OA passes through the second filter unit 113 where particles and chemical impurities are removed from the air. Thereafter, the air is mixed with an air stream circulating in the chambers 104 and 105 by the fan 112 and controlled at an optimum temperature by the temperature controller 111. Although not shown, a humidity controller is arranged either upstream or downstream of this temperature controller 111. Therefore, the humidity of the circulating air stream can also be controlled simultaneously with the temperature control. In FIG. 4, outside air is naturally taken from the outer air inlet OA in accordance with the pressure difference between the chamber 104 and the outside. However, it is also possible to provide another fan at the outer air inlet OA to forcedly take outer air into the chamber 104.

The air thus temperature-controlled by the temperature controller 111 is supplied by the fan 112 to the first filter unit 113 where particles and chemical impurities are removed from the air. The air is then supplied into the chamber 105 which houses the apparatus main body. Also, the first filter unit 113 is arranged on the entire surface of one side surface (upstream) of the chamber 105, and an evacuation surface made from, e.g., a punching metal, is formed on the entire surface of the other side surface (downstream) of the chamber 105. Accordingly, in this embodiment, the clean air can be supplied as a laminar flow into the chamber 105. The present invention is of course not limited to this embodiment. As an example, the first filter unit 113 can be arranged on the upper surface of the chamber 105 to constitute a downflow system in which the clean air is flowed along the optical axis of the projecting optical system PL. Alternatively, the filter unit 113 and an air inlet of the chamber 105 can be connected by a pipe or the like without providing the first filter unit 113 in the chamber 105.

In this embodiment, the filter units are arranged only at the air inlet of the chamber 105 and the outer air inlet of the chamber 104. However, it is also possible to provide filter units at the exit of the fan 112 and the exit of the temperature controller 111 to thereby prevent pollutants generated by the fan 112 and the temperature controller 111 from mixing into the circulating air. The point is that any configuration and arrangement can be adopted so long as pollutants (particles and chemical impurities) can be filtered out from air supplied into the chambers by arranging the filter units at the outer air inlet and in the air circulation path.

Each of the first and second filter units 113 and 114 consists of an HEPA filter (or a ULPA filter) for physically collecting particles present in air and a chemical filter for chemically removing or neutralizing chemical impurities such as ions and organic gases present in air. These filter units can of course be constituted by only one of the HEPA filter and the chemical filter, depending on the installation site of the filter units.

As the HEPA filter, it is possible to use commercially prepared filters based upon IES, which use a glass fiber or a glass asbestos fiber as a filtering agent. As the chemical filter, an active carbon filter, a zeolite filter, or an ion exchange resin filter can be used.

An active carbon filter is basically effective for almost all chemical pollutants (ions, gases, and organic substances). Generally, however, the active carbon filter has higher adsorptivity for an organic impurity having a larger molecular size, a larger intermolecular force, a lower solubility in water, and a lower polarity. In choosing the active carbon filter, it is necessary to take into consideration the surface area and the average pore size of active carbon and also the shape and the dust generation properties of active carbon. It is favorable to use an active carbon filter having a large surface area and a pore size meeting the molecular weight of an object to be collected. For example, it is possible to use a filter obtained by performing an active carbon treatment for a phenolic resin, such as KURACTIVE manufactured by KURARAY CHEMICAL Co., Ltd., or a filter formed by adding powdery active carbon to polyester fibers, such as VAPORSORB 1076 manufactured by EXTRACTION SYSTEMS INC. It is also possible to use a filter whose acid or alkali adsorption efficiency is improved by adding an acidic substance or a weak alkali substance to active carbon. Examples of the filter of this sort are KURASHEET T-B or T-F available from KURARAY CHEMICAL Co., Ltd., in which polyether urethane foam or polyester urethane foam is impregnated with coconut shell flour active carbon (for example, a T-B type filter added with an acidic substance is used to remove a basic gas and a T-F type filter added with a weak alkali substance is used to remove acetaldehyde, formaldehyde, or the like), and VAPORSORB 1073K available from EXTRACTION SYSTEMS INC. (for example, VAPORSORB 1073K can be used to remove an acid and $NH_3$). Like active carbon, zeolite is effective to remove nearly all chemical pollutants (ions, gases, and organic substances), and the pore size of zeolite is selected in accordance with the size of a pollutant to be removed.

To remove ionic chemical impurities ($NH_4^+$, amine, $SO_4^{2-}$, and $NO_x$), it is possible to use an ion exchange fiber filter using an ion exchange fiber, which is manufactured by, e.g., radiation-induced graft polymerization from a polypropylene fiber, or an ion exchange resin. There are two types of the ion exchange fiber, i.e., an acidic cation exchange fiber and a basic anion exchange fiber, so these fibers can be selectively used in accordance with the polarity of the ion of interest. Positive ions, such as $NH_4^+$ and amine, and a basic gas, can be adsorbed by the acidic cation exchange fiber, and negative ions, such as $SO_4^-$ and $NO_x$, and an acidic gas, can be adsorbed by the basic anion exchange fiber. For example, approximately 90% or more of $NH_4^+$ can be adsorbed even at low densities by the neutralization reaction with a strongly acidic cation exchange filter. Negative ions are adsorbed by the ion exchange reaction with a basic anion exchange fiber.

By constituting the air-conditioning system 110 as described above, it is possible to remove pollutants such as particles and chemical substances from the air flowing into the chambers 104 and 105 and thereby perform exposure in a cleaner environment. However, if a chemical amplification type positive resist treatment environment is constructed, which requires keeping an ammonia density below 1 ppb by removing ammonia using a chemical filter from air in a common clean room having an average ammonia density of a few ppb to a few tens of ppb, any currently commercially prepared chemical filter saturates in a few months or a few years. For this reason, to maintain the yield at a fixed level or higher, the chemical filter must be periodically exchanged.

The conventional approach by which the exchange timing of a chemical filter is known is to install an ammonia sensor downstream of the chemical filter and exchange the chemical filter at the time the ammonia density exceeds a predetermined value. However, even an ammonia sensor having the highest sensitivity of the presently developed sensors has a sensitivity of at most about 10 ppb. Therefore, when this sensor senses the saturation and breaking of a chemical filter, the service life is reached on almost the entire surface of the filter, so an optimum exchange timing may be missed. This is a practical problem as already described previously.

Figure 6:
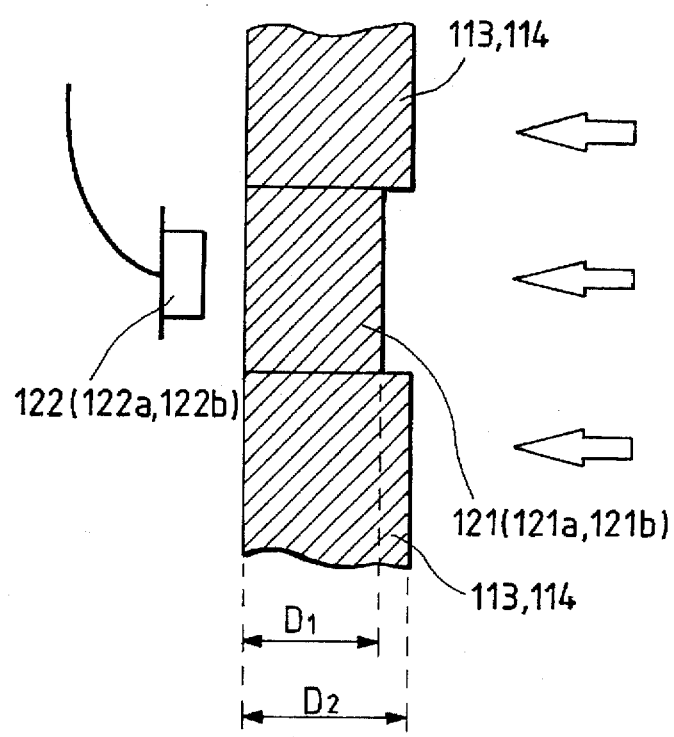
FIG. 6 is a view showing an example of a chemical filter exchange timing detector in the second embodiment.

In this embodiment, therefore, filter exchange timing detectors 121a and 121b are provided in portions of the filter units 113 and 114, and ammonia sensors 122a and 122b are arranged downstream of the detectors 121a and 121b. FIG. 6 is an enlarged view of this portion. As illustrated in FIG. 6, in this embodiment, the thickness (D1) of a portion 121 of each of the chemical filters 113 and 114 is made smaller than the thickness (D2) of the rest. Additionally, the ammonia sensor 122 is arranged downstream of the air stream indicated by arrows.

In the chemical filter with the above arrangement, when the thickness (D1) of the specific portion 121 is set at about 90% of the thickness (D2) of the rest, the pollution removal capacity becomes approximately 90% of the pollution removal capacity of the rest. Consequently, this specific portion reaches the service life in an operation time about 90% of the operation time of the rest. That is, in an environment in which the service life of the whole filter is about 10 months, the specific portion 121 reaches the service life earlier than the rest in about 9 months from the start of use, and the filter is broken in this specific portion. As a consequence, the ammonia sensor 122 arranged downstream of the specific portion senses ammonia passing through the chemical filter. As a result, it is possible to plan for chemical filter exchange, with enough time to spare, approximately one month before the service life of the whole filter is reached. This makes it possible to avoid an event in which the exchange timing of a chemical filter is missed or a chemical filter that is satisfactorily usable is exchanged.

Figure 7:
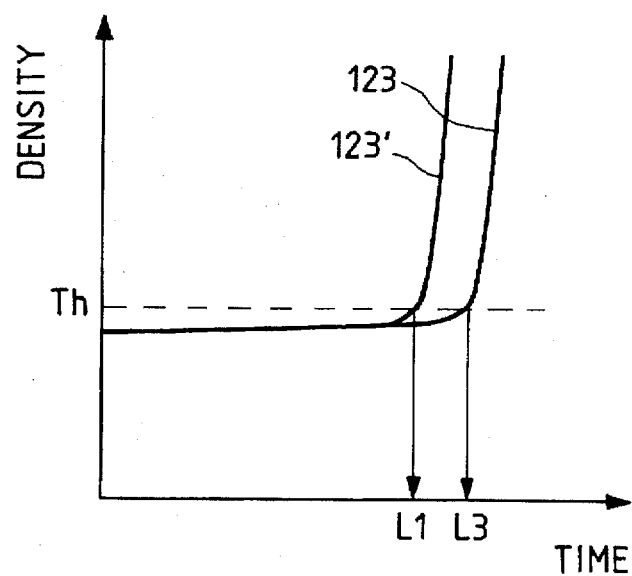
FIG. 7 is a graph showing a change with time of the pollution removal rate of a chemical filter.

FIG. 7 is a graph showing a change with time of the pollution removal rate of the chemical filter. In FIG. 7, time is plotted along the abscissa, and the density of a chemical impurity after it passes through the chemical filter is plotted along the ordinate. A curve 123' indicates the density change downstream of the specific portion 121 of the chemical filter, and a curve 123 indicates the density change downstream of the overall chemical filter. Assuming the allowable density (threshold value) of a chemical substance in this chemical filter is Th, the service life of the specific portion is L1, and the service life of the whole chemical filter is L3. As shown in FIG. 7, once the chemical filter saturates, the pollution removal rate abruptly decreases. For example, it is too late if the chemical filter is exchanged at the time the service life L3 is reached, so that the surface of a chemical amplification type positive resist may have the hard dissolution problem. In contrast, in this embodiment, it is possible to predict the service life LB of the whole chemical filter, long before it is reached, when the service life L1 of the specific portion 121 is reached. Accordingly, the exchange timing cannot be missed.

The sectional area of the entire chemical filter 113 of the chamber 5 which accommodates the main body of the exposure apparatus in FIGS. 4 and 5 is 3 to 4 $m^2$, and the sectional area of the specific portion 121 with a low pollution removal capacity can be at most a few $cm^2$. Therefore, even if this specific portion 121 is broken the influence on the whole apparatus is negligibly small. Furthermore, the formation of a hard dissolution surface of a photoresist can be better suppressed by arranging the specific portion 121 as far apart from a wafer as possible. Consequently, the exchange timing of the chemical filter can be safely detected.

Figure 8:
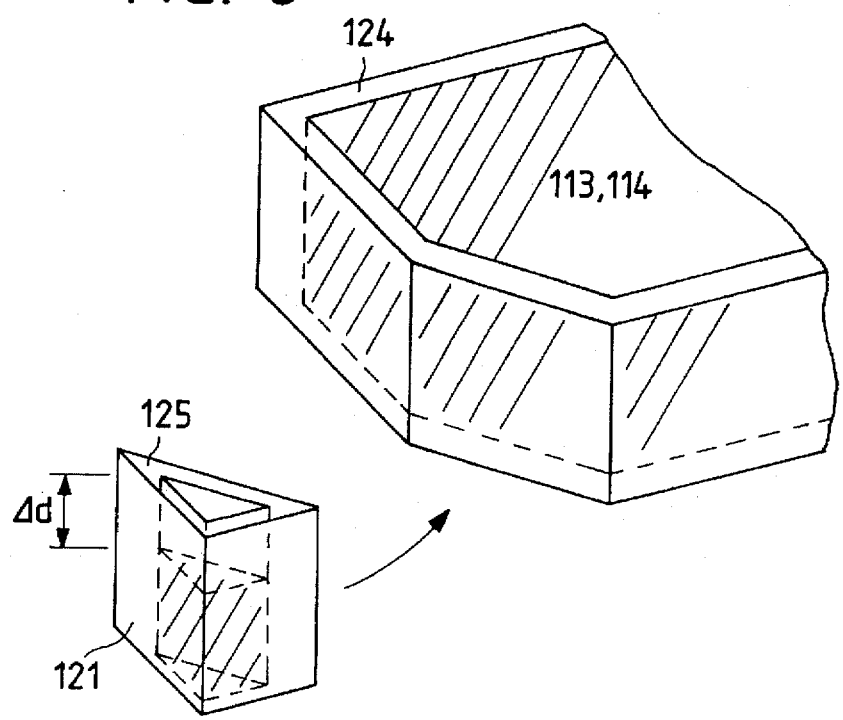
FIG. 8 is a view showing a practical example of the arrangement of the chemical filter exchange timing detector.
Figure 9:
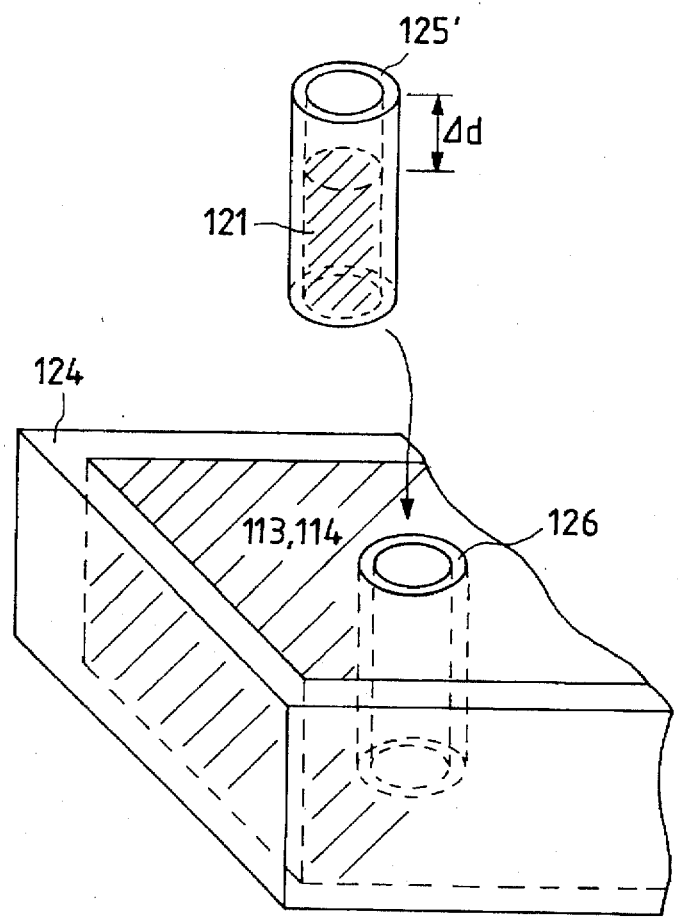
FIG. 9 is a view showing another practical example of the arrangement of the chemical filter exchange timing detector.
Figure 10:
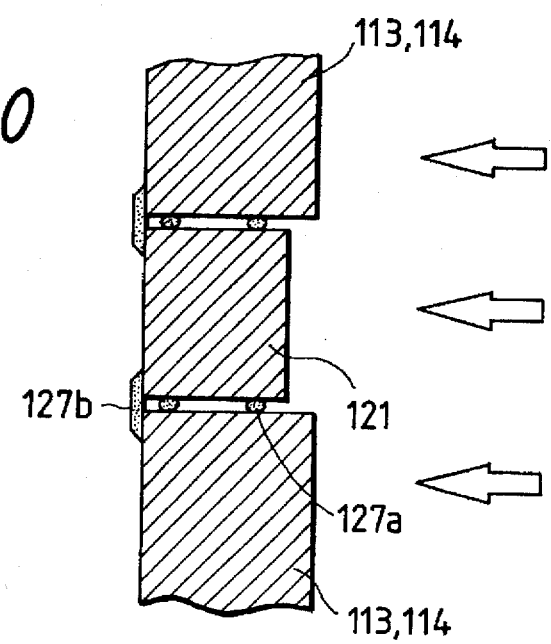
FIG. 10 is a view showing another example of the chemical filter exchange timing detector in the second embodiment.

FIGS. 8 to 10 illustrate one practical method of forming a specific portion with a lower pollution removal capacity than that of the rest in the chemical filter. Generally, the chemical filter 113 or 114 is airtightly housed in a casing 124. As shown in FIG. 8, therefore, a corner portion 125 of the casing 124 is formed as a separate unit, and the chemical filter 121 which is thinner by $\Delta d$ than and made from the same material as the chemical filter in the casing 124 is housed in the casing 125. Alternatively, as shown in FIG. 9, a through hole 126 is formed in the casing and the chemical filter, and a cylindrical casing 125' containing the chemical filter 121 which is thinner by $\Delta d$ than and made from the same material as the chemical filter in the casing 124 is fitted into the through hole 126. Alternatively, as illustrated in FIG. 10, the chemical filter 121 which is thinner by $\Delta d$ than and made from the same material as the chemical filter in the casing 124 can also be airtightly fitted in a portion of the chemical filter in the casing 124 via seal members 127a and 127b, without using the casing 125 or 125'.

In this embodiment, the filter (specific portion) 121 for detecting the filter exchange timing is formed as a separate unit thinner than the chemical filters 113 and 114. However, this embodiment is not limited to this structure. As an example, when the chemical filters 113 and 114 are formed by stacking thin filters, it is possible to reduce the pollution removal capacity of the specific portion 121 by decreasing the number of layers to be stacked in that specific portion. Also, in this embodiment, the pollution removal capacity of the specific portion of the chemical filter is reduced by making that specific portion thinner than the rest of the filter. However, this embodiment is not restricted to this structure. For example, when an active carbon filter is used, the pollution removal capacity can be decreased in accordance with the surface area and the average pore size without changing the thickness. Therefore, by partially changing the surface area and the average pore size of the active carbon filter, it is possible to decrease the pollution removal capacity of the specific portion. Also, when an active carbon filter added with an adsorbing substance is used, the pollution removal capacity can be decreased in accordance with the addition amount of the adsorbing substance without changing the thickness. Therefore, the pollution removal capacity of the specific portion can be decreased by partially changing the addition amount of the adsorbing substance to the active carbon filter.

Figure 11:
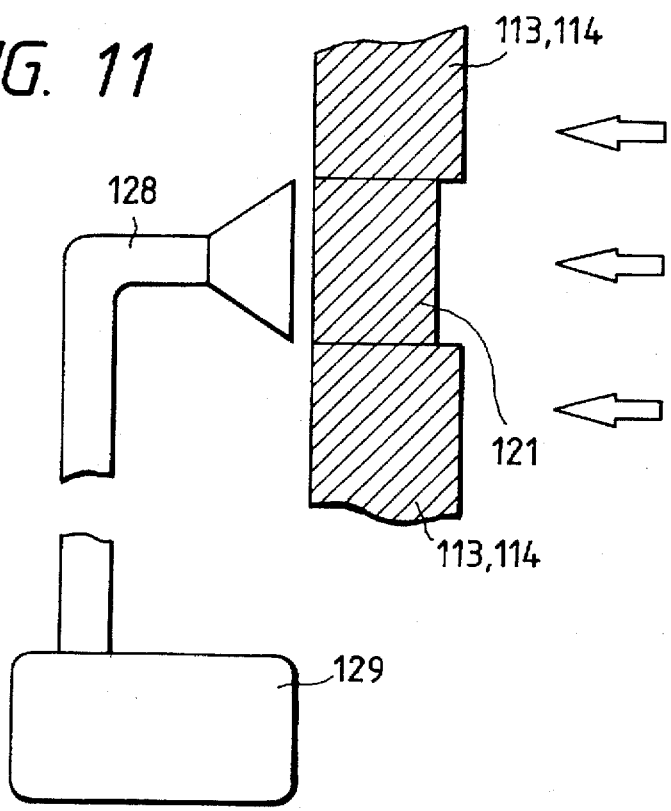
FIG. 11 is a view showing another example of a pollutant sensor in FIG. 6.

FIG. 11 shows another example of the pollutant sensor arranged downstream of the specific portion 121 of the chemical filter. In FIG. 11, instead of installing the sensor 122 close to and downstream of the specific portion 121, air passing through the specific portion 121 is guided to a sensor module 129, arranged in a remote place, through a sampling tube 128, thereby sensing a pollutant. In FIG. 11, the degree of freedom in the selection of a sensor is increased because the sensor 122 need not be miniaturized as illustrated in FIG. 6. Note that in employing the arrangement as illustrated in FIG. 11, it is preferable to incorporate a small suction pump to allow the sampling tube to efficiently collect the air passing through the specific portion 121.

Figure 12:
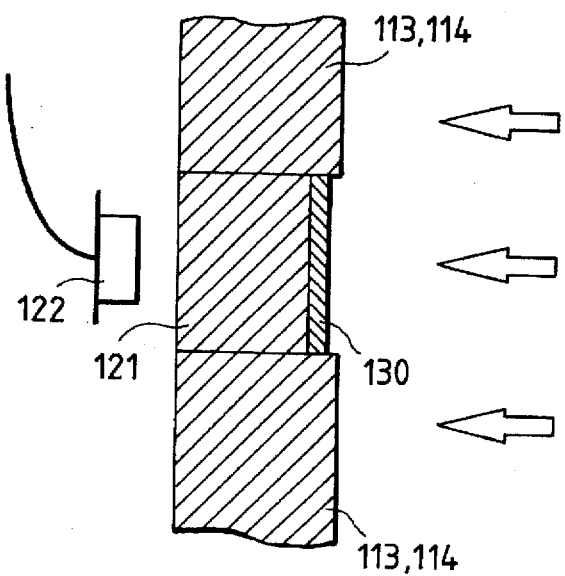
FIG. 12 is a view showing still another example of the chemical filter exchange timing detector in the second embodiment.

FIG. 12 shows a modification of the specific portion 121 for detecting the filter exchange timing in this embodiment. In FIG. 12, a member 130 serving as an aerodynamic load resistance is further added to the arrangement shown in FIG. 6. When the pollution removal capacity is reduced by decreasing the thickness of the specific portion 121 as shown in FIG. 6, the aerodynamic load resistance (pressure loss) in that specific portion 121 becomes lower than that in the other portion 113 or 114. Consequently, a larger amount of the air stream indicated by the arrows flows into the specific portion 121. Accordingly, the specific portion 121 acceleratedly saturates to reach the service life, and this may make it impossible to accurately predict the saturation timing (service life) of the whole chemical filter as described previously. In FIG. 12, therefore, a chemically inert particle filter 130 (such as an HEPA filter) is arranged in series on almost the entire surface of and upstream of the specific portion 121, thereby canceling out the pressure loss. As a result, the flow rate of air passing through the specific portion 121 of the chemical filter can be made essentially equal to the flow rate of air passing through the other portion 113 or 114. Consequently, the exchange timing of the chemical filter can be accurately predicted even when the thickness of the filter in the specific portion 121 is decreased.

As illustrated in FIGS. 4 and 5, in this embodiment, the detection signal of the pollutant sensor 122 provided downstream of the specific portion 121 of the chemical filter is supplied to a controller 131. If the pollutant sensor 122 senses a pollutant made from a basic substance such as ammonia or if the detection value reaches a predetermined value, the controller 131 can determine that the specific portion 121 has saturated and broken (i.e., has reached the service life) earlier than the whole filter. Accordingly, the controller 131 displays this information on a display 132 to inform the operator of the arrival of the filter exchange timing. As a result, the operator can exchange the filter with enough time to spare without missing the exchange timing. It is of course possible to automatically stop the exposure operation at the time the pollutant sensor 122 senses a pollutant in an amount larger than the allowable amount or when a predetermined time has elapsed after that time.

The above second embodiment has been described by taking as an example the case where the present invention is applied to an exposure apparatus using a chemical amplification type positive resist. The present invention is also preferably applicable to an air-conditioning system of a chamber for housing an optical system which is clouded upon being irradiated with light (UV light or DUV light) in the ultraviolet region. In addition to an exposure apparatus, the present invention can also be applied to all kinds of semiconductor fabrication apparatuses, such as an etching apparatus and an ashing apparatus, which are required to perform processes in a clean environment from which physical pollutants and chemical pollutants are removed. The present invention is most preferably applicable to an apparatus sensitive to pollution caused by a very slight amount of a chemical pollutant. Furthermore, the present invention is not restricted to semiconductor fabrication apparatuses but can be used to determine the exchange timing of a filter of all sorts of air-conditioning systems requiring a clean environment from which pollutants are removed using a filter unit.

As described above, the present invention is not limited to the above embodiments but can take various arrangements without departing from the spirit and scope of the invention.

What is claimed is:

1. A gas cleaning apparatus comprising:

a filter unit for removing a chemical substance from a gas;

an adsorbing member arranged upstream and apart from said filter unit, in relation to a flowing direction of the gas, to adsorb a sample of the chemical substance from the gas before the gas enters the filter unit; and a determination unit for measuring an amount of the adsorbed chemical substance and determining a service life of said filter unit based on the measured amount of the adsorbed chemical substance.

2. An apparatus according to claim 1, wherein the chemical substance includes one of ammonia, an amine compound, sulfur oxide, silicon oxide, and ion derivatives thereof.

3. An apparatus according to claim 1, wherein said determination unit includes a detector for detecting a resonance frequency of said adsorbing member, and an arithmetic unit for calculating the amount of the adsorbed chemical substance.

4. An apparatus according to claim 1, further comprising:

a filter arranged downstream of said filter unit, in a relation to the flowing direction of the gas, to remove particles from the gas.

5. An apparatus according to claim 1, further comprising:

an exposure system for exposing a photosensitive substrate with an image of a pattern on a mask; and a chamber for housing said exposure system so that said exposure system is isolated from outside air, wherein said filter unit and said adsorbing member are arranged at an outside air inlet of said chamber.

6. An exposure apparatus comprising:

a filter unit for removing a chemical substance from a gas circulated in a chamber;

an adsorbing member arranged upstream and apart from said filter unit, in relation to a flowing direction of the gas, to adsorb a sample of the chemical substance from the gas before the gas enters the filter unit; and a determination unit for measuring an amount of the adsorbed chemical substance and determining a service life of said filter unit based on the measured amount of the adsorbed chemical substance.

7. An apparatus according to claim 6, further comprising:

a cover disposed in said chamber and covering a light source, an elliptic mirror, and a reflection mirror;

a fan for supplying gas that has passed through said filter unit into a space within said cover; and a duct for discharging the gas from said space.

8. An apparatus according to claim 6, including a pair of said filter units disposed, respectively, near a light source and an optical element of an illuminating optical system; and a corresponding pair of fans, each supplying gas from the corresponding filter unit to the corresponding one of said light source and said optical element.

9. A gas cleaning apparatus comprising:

a filter for removing a chemical substance from a gas, said filter including a specific portion having a removal capacity for said substance that is lower than a removal capacity of a remainder of said filter for said substance; and a sensor arranged downstream of said specific portion to sense said substance.

10. An apparatus according to claim 9, further comprising:

a load member for compensating for a pressure loss in said specific portion.

11. An apparatus for exposing a photosensitive substrate with an image of a pattern on a mask, comprising:

a filter for removing a chemical substance from a gas in a chamber, said filter including a specific portion having a removal capacity for said substance that is lower than a removal capacity of a remainder of said filter for said substance; and a sensor arranged downstream of said specific portion to sense the substance.

* * * * *